United States Patent
Zhang et al.

(10) Patent No.: US 7,056,775 B2
(45) Date of Patent: Jun. 6, 2006

(54) SEMICONDUCTOR DEVICE AND PROCESS FOR FABRICATING THE SAME

(75) Inventors: Hongyong Zhang, Yamato (JP); Hideto Ohnuma, Atsugi (JP); Yasuhiko Takemura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/172,908

(22) Filed: Jul. 5, 2005

(65) Prior Publication Data

US 2005/0245053 A1 Nov. 3, 2005

Related U.S. Application Data

(62) Division of application No. 10/252,393, filed on Sep. 24, 2002, now Pat. No. 6,924,213, which is a division of application No. 09/576,490, filed on May 23, 2000, now Pat. No. 6,455,401, which is a division of application No. 08/768,563, filed on Dec. 18, 1996, now Pat. No. 6,077,758, which is a division of application No. 08/496,085, filed on Jun. 28, 1995, now Pat. No. 6,071,764, which is a division of application No. 08/277,746, filed on Jul. 20, 1994, now Pat. No. 5,529,937.

(30) Foreign Application Priority Data

Jul. 27, 1993 (JP) .................................. 5-204774
Jul. 30, 1993 (JP) .................................. 5-208996

(51) Int. Cl.
H01L 21/786 (2006.01)
(52) U.S. Cl. ..................................................... 438/154
(58) Field of Classification Search ................. 438/154
See application file for complete search history.

(56) References Cited

U.S. PATENT DOCUMENTS

RE28,385 E 4/1975 Mayes
RE28,386 E 4/1975 Heiman et al.

(Continued)

FOREIGN PATENT DOCUMENTS

EP 0 178 447 4/1986
JP 60-105216 6/1985

(Continued)

OTHER PUBLICATIONS

R. Kakkah et al., "Crystalized Si films by low-temperature rapid thermal annealing of amorphous silicon." J. Appl. Phys., 65(5), Mar. 1, 1989, pp. 2069-2072.

(Continued)

*Primary Examiner*—Asok Kumar Sarkar
(74) *Attorney, Agent, or Firm*—Eric J. Robinson; Robinson Intellectual Property Law Office, P.C.

(57) ABSTRACT

After a pattern is transferred on silicon film crystallized by annealing, the silicon film is annealed by radiation of intense rays for a short time. Especially, in the crystallizing process by annealing, an element which promotes crystallization such as nickel is doped therein. The area not crystallized by annealing is also crystallized by radiation of intense rays and a condensed silicon film is formed.

After a metal element which promotes crystallization is doped, annealing by light for a short time is performed by radiating intense rays onto the silicon film crystallized by annealing in an atmosphere containing halide. After the surface of the silicon film is oxidized by heating or by radiating intense rays in a halogenated atmosphere and an oxide film is formed on the silicon film, the oxide film is then etched. As a result, nickel in the silicon film is removed.

16 Claims, 9 Drawing Sheets

U.S. PATENT DOCUMENTS

| | | | |
|---|---|---|---|
| 4,226,898 A | | 10/1980 | Ovshinsky et al. |
| 4,231,809 A | | 11/1980 | Schmidt |
| 4,276,688 A | * | 7/1981 | Hsu .......................... 438/154 |
| 4,300,989 A | | 11/1981 | Chang |
| 4,309,224 A | | 1/1982 | Shibata |
| 4,330,363 A | | 5/1982 | Biegesen et al. |
| 4,331,709 A | | 5/1982 | Risch et al. |
| 4,379,020 A | | 4/1983 | Glaeser et al. |
| 4,399,605 A | * | 8/1983 | Dash et al. ............... 438/154 |
| 4,507,846 A | * | 4/1985 | Ohno ......................... 438/154 |
| 5,043,224 A | | 8/1991 | Jacodine et al. |
| 5,145,808 A | | 9/1992 | Sameshima et al. |
| 5,147,826 A | | 9/1992 | Liu et al. |
| 5,200,630 A | | 4/1993 | Nakamura et al. |
| 5,221,423 A | | 6/1993 | Sugino et al. |
| 5,225,355 A | | 7/1993 | Sugino et al. |
| 5,254,480 A | | 10/1993 | Tran |
| 5,262,350 A | | 11/1993 | Yamazaki et al. |
| 5,262,654 A | | 11/1993 | Yamazaki |
| 5,275,851 A | | 1/1994 | Fonash et al. |
| 5,278,093 A | | 1/1994 | Yonehara |
| 5,296,405 A | | 3/1994 | Yamazaki et al. |
| 5,298,075 A | | 3/1994 | Lagendijk |
| 5,308,998 A | | 5/1994 | Yamazaki et al. |
| 5,313,075 A | | 5/1994 | Zhang et al. |
| 5,352,291 A | | 10/1994 | Zhang et al. |
| 5,366,926 A | | 11/1994 | Mei et al. |
| 5,403,772 A | | 4/1995 | Zhang et al. |
| 5,424,230 A | | 6/1995 | Wakai |
| 5,488,000 A | | 1/1996 | Zhang et al. |
| 5,529,937 A | | 6/1996 | Zhang et al. |
| 5,550,070 A | | 8/1996 | Funai et al. |
| 5,595,944 A | | 1/1997 | Zhang et al. |
| 5,605,846 A | | 2/1997 | Ohtani et al. |
| 5,612,250 A | | 3/1997 | Ohtani et al. |
| 5,639,698 A | | 6/1997 | Yamazaki et al. |
| 5,646,424 A | | 7/1997 | Zhang et al. |
| 5,773,846 A | | 6/1998 | Zhang et al. |
| 5,869,363 A | | 2/1999 | Yamazaki et al. |
| 5,888,857 A | | 3/1999 | Zhang et al. |
| 5,897,347 A | | 4/1999 | Yamazaki et al. |
| 5,904,770 A | | 5/1999 | Ohtani et al. |

FOREIGN PATENT DOCUMENTS

| | | |
|---|---|---|
| JP | 61-063017 | 4/1986 |
| JP | 61-099347 | 5/1986 |
| JP | 62-181419 | 8/1987 |
| JP | 01-187814 | 7/1989 |
| JP | 2-0140915 | 5/1990 |
| JP | 05-062899 | 3/1993 |
| JP | 05-082442 | 4/1993 |
| TW | 236711 | 12/1994 |

OTHER PUBLICATIONS

G. Liu et al., "Polycrystalline silicon thin film transistors on Corning 7059 glass substrate using short time, low-temperature processing," Appl. Phys. Lett. 62(20), May 17, 1993, pp. 2554-2556.

G. Liu et al., "Selective area crystallization of amorphous silicon films by low-temperature rapid thermal annealing," Appl. Phys. Lett. 55(7), Aug. 14, 1989, pp. 660-662.

R. Kakkad et al., "Low Temperature Selective Crystallization of Amorphous Silicon," Journal of Non-Crystalline Solids, 115, 1989, pp. 66-68.

S. Takenaka et al., Jpn. J. Appl. Phys. 29(12) (1990) L2380, "High Mobility Poly-Si TFTs Using SPC a-Si Films Deposited by PECVD," pp. L2380-2383.

T. Hempel et al., Solid State Communications, vol. 85, #11, Mar. 1993, Received after Mar. 22, 1993, pp. 921-924.

A.V. Dvurechenskii et al., Phys. Status sol., A95, (1986), pp. 635-640.

J.M. Green et al., IBM Tech. Discl. Bulletin, 16(5) (1973) "Method to Purify Semiconductor Wafers," pp. 1612-1613.

Y. Kawazu et al., J.J. Appl. Phys., 29, 12(1990) "Low temperature crystallization of a-Si:H by $NiSi_2$ . . . ," pp. 2698-2704.

C. Hayzelden et al., J. Appl. Phys., 73, 12(1993) " . . . Silicide Mediated Recrystallization of Q-Si:Ni . . . ," pp. 8279-8289.

C. Hayzelden et al., Appl. Phys. Lett., 60,2(1992) " . . . Silicide Mediated Crystallization of a-Si," pp. 225-227.

A.Y. Kuznetsov et al., Inst. Phys. Conf. Ser #134.4, Proceedings of Royal Microscopical Soc. Conf. 1993, pp. 191-194.

Y.N. Erokhin et al., Appl. Phys. Lett. 63, 23 (1993) "Spatially Confined $NiSi_2$ Formation On . . . Premorphised Si," pp. 3173-3175.

J. Stoemnos et al., Appl. Phys. Lett, 58,11 (1991) "Crystallization of Q-Si . . . Utilizing Gold," pp. 1196-1198.

J.L. Batstome et al., Solid State Phenomena, 37-38 (1994) Microscopic Processes in Crystallization, pp. 257-268.

A.Y. Kuznetsov, et al., Nucl Insts. Meth. Phys. Res., B80/81 (1993), "Recrystallization of a-Si Due to NiSi . . . ," pp. 990-993.

R.C. Cammasata et al., J. Mater. Res., 5,10 (1990) "Silicide Precipitation and Si Crystallization in a-Si:Ni," pp. 2133-2138.

J.J.P. Bruines et al., Appl. Phys. Lett, 50, 9 (1987) "..Pulsed Laser Annealing of a-Si," pp. 507-509.

Czubatyi et al., "Low-Temperature Polycrystalline-Silicon TFT on 7059 Glass," IEEE Electron Device Letters, vol. 10, No. 8, Aug. 1989, pp. 349-351.

Kawazu et al., "Low-Temperature Crystallization of Hydrogenated Amorphous Silicon Induced by Nickel Silicide Formation," Dec. 1990, Japanese Journal of Applied Physics, vol. 29, No. 12, pp. 2698-2704.

Mimura et al., "A High-Resolution Active Matrix Using p-Channel SOI TFTs," Apr. 1988, IEEE Transaction on Electron Devices, vol. 35, No. 4, pp. 418-425.

Ghandhi, VLSI Fabrication Principles, 1983, JA Wiley-Interscience publication, 1st Edition, pp. 388-391, 588.

* cited by examiner

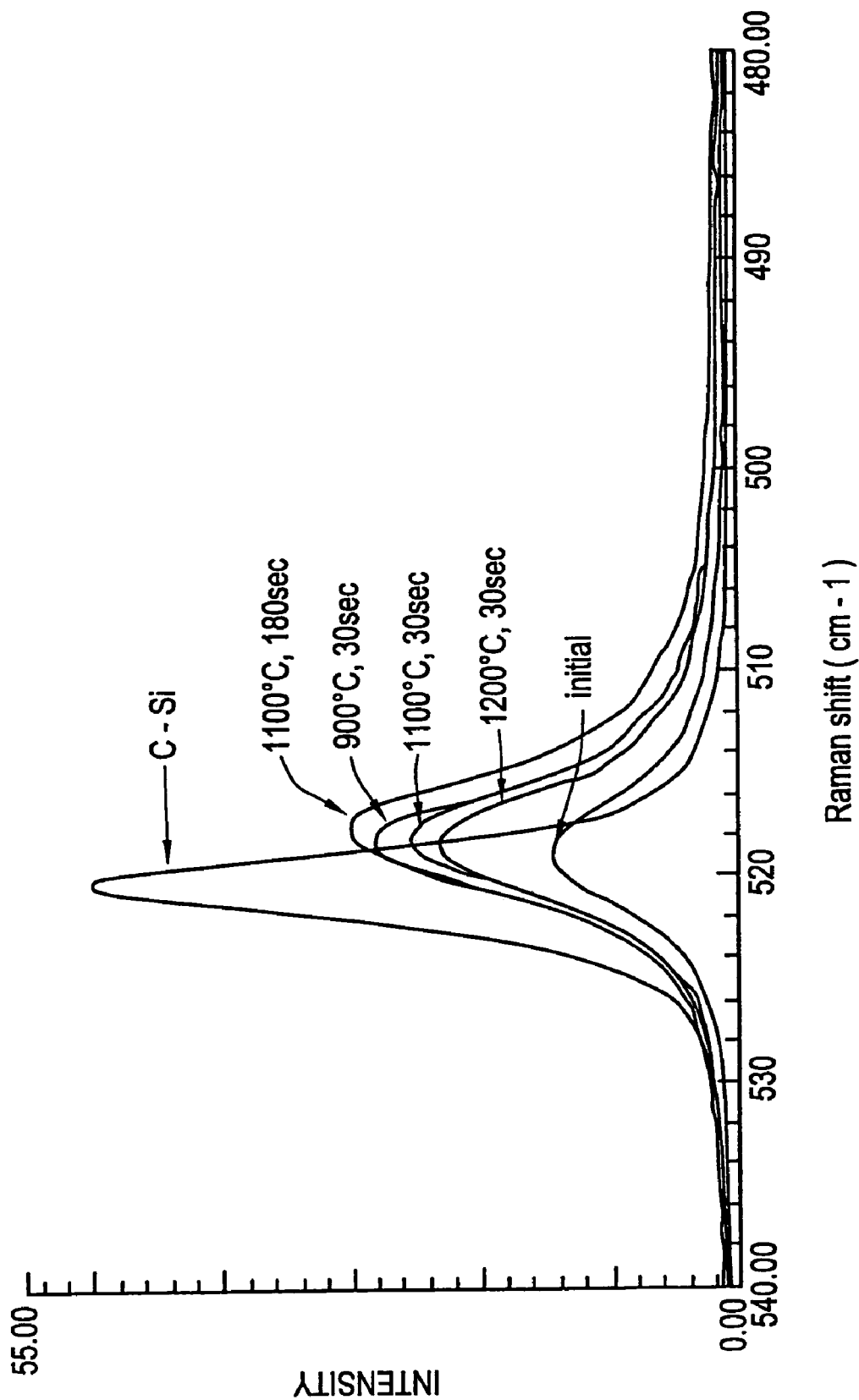

VISIBLE OR NEAR INFRARED LIGHT

LASER LIGHT

PTFT    NTFT

LASER LIGHT

LASER LIGHT

SEMICONDUCTOR DEVICE AND PROCESS FOR FABRICATING THE SAME

BACKGROUND OF THE INVENTION

1. Field of the Invention

The present invention relates to a method of fabricating a semiconductor device produced by depositing non-monocrystal silicon (called Si hereinafter) film on insulating film formed on an insulating substrate made of glass or the like or a variety of substrates, for example a thin film transistor (TFT), a thin film diode (TFD) and a thin film integrated circuit containing transistors and diodes, especially a thin film integrated circuit for an active liquid crystal display (LCD).

2. Description of the Related Art

Recently, a semiconductor device in which TFTs are mounted on an insulating substrate made of glass or the like, for example an active liquid crystal display and an image sensor in which TFTs are used for activating pixels, has been developed.

Generally, thin film Si semiconductors are used for the TFTs used in the above-mentioned devices. The above-mentioned thin film Si semiconductor comprises two types of semiconductors, these being an amorphous Si semiconductor (a-Si) and a crystalline Si semiconductor. The amorphous Si semiconductor is used most generally because it can be readily produced at low temperatures by a vapor phase process, and is suitable for mass production; however, it is less conductive than a crystalline Si semiconductor.

Therefore, it is strongly desired that a fabricating method of TFTs made of a crystalline Si semiconductor should be established which can hereinafter obtain a higher speed characteristics. As a crystalline Si semiconductor, polycrystalline silicon, microcrystalline silicon, amorphous silicon containing a crystalline component and a semi-amorphous silicon which is in an intermediate condition of a crystal and an amorphous are well known.

As the production method of a thin film crystalline Si semiconductor, the following methods are known:

(1) Crystalline film is deposited directly.
(2) First, amorphous semiconductor film is deposited and next, it is crystallized by the energy of a laser beam.
(3) First, amorphous semiconductor film is deposited and next, it is crystallized by applying thermal energy for a long time (annealing).

However, even formation of a film which has a good semiconductive characteristic on the overall surface of a substrate by the method described in (1) is technically difficult. This method also has a cost problem in that a low-priced glass substrate cannot be used because the film is formed at a temperature of 600° C. or, more. Deposition of film which has a good characteristic at low temperatures by this method is difficult. As crystals grow perpendicularly to the substrate, film formed by this method is not suitable for TFTs which have flat conductivity.

For example, if an excimer laser used most generally at present is used in the method described in (2), this method has the problem that throughput is low because the area on which the laser beam is radiated is small. This method also has another problem in that the stability of the laser is not sufficient to form film evenly on the overall surface of a substrate having a large area. Further, this method requires a substrate to be heated and irradiated by a laser in a vacuum in order to crystallize well. Therefore, this method has the problem that throughput is limited.

The method described in (3) has the advantage that a substrate having a large area can be processed by this method compared with the methods described in (1) and (2). However, this method also requires high temperatures of 600° C. or more to heat a substrate on which amorphous film is formed. If a low-priced glass substrate is used, the heating temperature must be lowered. Especially at present, LCD screens are becoming larger and larger and therefore, a large-sized glass substrate is required to be used for such large screens. If a large-sized glass substrate is used, a significant problem of shrinkage or distortion caused in the heating process essential for producing semiconductor devices and which deteriorates the precision of mask alignment occurs. Especially if a substrate made of No. 7059 glass manufactured by Corning Inc. used most generally at present is used, distortion occurs at a temperature of 593° C. and significant deformation occurs in the prior crystallizing process due to heating. The heating time required for crystallization in the conventional process exceeds 20 to 30 hours and therefore, reduction of the time is also required together with reduction of the heating temperature.

SUMMARY OF THE INVENTION

The object of the present invention is to provide a means of solving the above-mentioned problems. In detail, the object is to provide a process in which good crystallization is obtained at lower heating temperatures, in other words, the effect on the glass substrate is reduced where a method by which film made of amorphous silicon is crystallized by heating is used.

Another object of the present invention is to provide a means of reducing or removing a metal element (a catalytic metal element) added to silicon film to promote crystallization.

DETAILED DESCRIPTION OF THE INVENTION

In the first process according to the present invention, crystallized silicon film is heated selectively by irradiating strong light on the surface of Si film crystallized by a metal element which promotes crystallization in an ambient atmosphere containing chloride gas such as hydrogen chloride (HCl), carbon tetrachloride ($CCl_4$) and silicon tetrachloride ($SiCl_4$), or fluoride gas such as nitrogen trifluoride ($NF_3$) and dicarbon hexafluoride ($C_2F_6$) to 10 to 90%. Producing plasma by excitation of a microwave or a high frequency has an effect of promoting the reaction during irradiation with strong-light.

If strong beams, for example light between near infrared rays and visible light, preferably light from 0.5 to 4 μm in wavelength (for example infrared rays with peaks at 1.3 μm in wavelength) are irradiated according to the present invention, it is desirable that beams are irradiated only for a relatively short time of approx. from 10 to 1000 seconds and that the surface of silicon film is heated until it is at from 900 to 1200° C. As the light in the above-mentioned wavelength is absorbed by Si film and is not absorbed by a substrate substantially, selective heating of the Si film is enabled without having an effect on a substrate if beams are irradiated only for the above-mentioned time.

Especially, visible light, especially light in wavelength of 0.5 μm or less is absorbed well by intrinsic or substantially intrinsic amorphous silicon and can be converted to heat. Near infrared rays or visible radiations from 0.5 to 4 μm in wavelength are absorbed effectively by intrinsic or substantially intrinsic crystallized silicon film in which phosphorus or boron is contained only to $10^{17}$ cm$^{-3}$ or less and can be converted to heat. On the other hand, far infrared radiation 10 μm or more in wavelength is absorbed by a glass substrate and can be converted to heat. However, if most light are light 4 μm or less in wavelength, little light is absorbed by glass. That is, near infrared rays or visible radiations from 0.5 to 4 μm in wavelength are suitable for heating crystallized Si film formed on a glass substrate selectively.

If ultraviolet rays of which wavelength is shorter than the above-mentioned light are used, they are absorbed not only by Si film but by most substrate materials and therefore, the most suitable time for irradiating light should be shorter. For example, in case of light 248 nm in wavelength, it is desirable that the above-mentioned time is 1 μsec. or less. If the above-mentioned light is irradiated for a longer time than the above-mentioned time, much light is absorbed by the substrate, which causes deformation of the substrate. As described above, the amount of light must be selected so that the temperature on the surface of the Si film exceeds 1000° C. temporarily by irradiation of light for an extremely short time. The first irradiation cannot oxidize Si film fully because rise or fall of temperature on the surface of Si film is momentary. Therefore, multiple irradiations are required. In this case, the thickness of the formed oxide film depends upon the number of irradiations.

It is ideal that a pulse oscillating laser such as excimer laser is used as a light source to irradiate with ultraviolet rays for the above-mentioned extremely short time. A variety of excimer lasers emit laser light 100 nsec. or less in pulsewidth. A light equivalent to a laser light may be used.

When the temperature of a substrate was at 600° C. or less, preferably 400° C. or less while film formed on the substrate was irradiated by strong beams according to the present invention, the effect of oxidation was enhanced.

By the high temperature described above, a metal element in the Si film reacts with chloride or fluoride gas in an ambient atmosphere though the reaction is performed only for a short time and chloride or fluoride metal is formed on the surface of the Si film. As its boiling point is low, it is vaporized in the ambient atmosphere to reduce a density of the metal element in the Si film. Further, after the strong beam irradiating process is finished, the formed chloride or fluoride metal can also be removed by cleaning the Si film with pure water fully. However, the other elements contained in the Si film, for example alkaline elements such as sodium and potassium are also removed at the same time by the above-mentioned process.

In such annealing, Si film is often peeled because of the difference in coefficient of thermal expansion between the Si film and the substrate and in the temperature between the surface of said Si film and the interface between said substrate and said Si film. If film covers the whole or a large area of the substrate, peeling of the film is especially remarkable. Therefore, it is desirable that peeling of the film is prevented by dividing the film into satisfactory small areas or leaving the space between films sufficiently not to absorb extra heat. As the whole of a substrate is prevented from being heated through the Si film according to the above-mentioned way, shrinkage of the substrate by heat can be restrained to the minimum.

As the temperature of the film is raised by irradiating strong light, crystallization of the Si film is also promoted more as the secondary effect of the present invention. It has been observed that needle-shaped crystals grow not in the direction of the film thickness but in the direction along the surface of a substrate in Si film crystallized by addition of nickel. The width of the above-mentioned needle-shaped crystals is approx. 0.5 to 3 times of the thickness of the Si film and they grow little laterally, that is, in the direction of the side of them. Therefore, amorphous areas or areas which are crystallized only at the same extent as them are left between crystals. In the above-mentioned amorphous areas, crystallization is not completed even by annealing for a long time and if such a semiconductor is used for TFT, a problem that the characteristic of TFT cannot be enhanced fully occurs.

As high temperature of 600° C. or more can be obtained by the process of irradiating strong beams according to the present invention, the present invention contributes to promotion of further crystallization of the above-mentioned areas which are crystallized only to the low extent. That is, it is because according to the present invention crystals grow epitaxially in the sides of needle-shaped crystals to crystallize amorphous areas.

When strong light is irradiated according to the present invention, many dangling bounds of silicon may be formed by thermal energy. These dangling bonds can be reduced (i.e. neutralized) by thermally annealing in an atmosphere containing hydrogen at a temperature of from 200 to 450° C. and therefore, the characteristics and reliability of various semiconductor devices, for example, a thin film transistor (TFT) and a thin film diode (TFD) can be enhanced.

In the second process according to the method of the present invention, oxide is formed on the surface of heated Si film crystallized by a catalytic metal element in ambient oxidizing atmosphere containing chloride or fluoride gas to 10 to 90%. For the temperature of oxidization, the temperature at which a substrate does not warp or shrink is desirable. For example, an oxide film a thickness of from 40 to 100 Å is formed on the surface of the film at a temperature of 550° C.

At this time, producing plasma by excitation of a microwave or a high frequency has an effect of promoting the reaction. Oxide can be formed not only by heating but by irradiating strong light in the above-mentioned atmosphere.

Metal elements existing in Si film, especially near the surface in large quantity are absorbed into the oxide selectively by formation of the oxide film described above. Then, such metal elements can be removed or reduced by removing said oxide film in an etching process. In this process, thermal or light energy can be given to the Si film both by thermal oxidation and by oxidation by irradiating strong light and at the same time the crystallinity of the Si film can be improved.

When after such a strong beam irradiating process annealing is performed again, the effect of the present invention can be further enhanced.

According to the present invention, as described above, a catalytic metal element in silicon film is deposited on the surface of an Si film as chloride or fluoride, vaporized or trapped in oxide in large quantity and etched. As a result, the density of metal elements in the Si film can be reduced to up to one fifth or less of that before processing. At the same time, Si film can be heated by irradiating strong light or by heating during oxidation and crystallization can be enhanced. A glass substrate absorbs few infrared rays even if strong light is irradiated and therefore, annealing by light can be performed without heating so much that the glass substrate cannot be used industrially because of softening or shrinkage.

In the third process according to the method of the present invention, strong light or laser light are irradiated on non-monocrystal semiconductor film crystallized by heating at a temperature of 600° C. or less in order to promote crystallization further. At the same time by irradiating strong light or laser light, the quality of said film is also condensed. The third process is characterized by the above-mentioned condensation of quality of film. In detail, in said third process, an Si film is heated by irradiating a laser light on said silicon film or by irradiating light between near infrared rays and visible light, preferably light 0.5 to 4 μm in wavelength, for example, infrared rays with peaks at 1.3 μm in wavelength for a relatively short time of approx. from 10 to 1000 seconds on said silicon film. The heating promotes crystallization. The third process is characterized by the promotion of crystallization. It is desirable that the wavelength of the light used is absorbed into an Si film but not absorbed into a glass substrate substantially. Further, in such annealing, the Si film is often peeled because of the difference in the coefficient of thermal expansion between an Si film and a substrate and in the temperature between the surface of the Si film and the interface between the substrate and the Si film. If film covers the whole of a substrate, peeling is especially remarkable. Therefore, peeling of the film can be prevented by dividing the film into fully small areas and leaving enough space between the films not to absorb extra heat. As only a part of the surface of a substrate is heated through the Si film, shrinkage of said substrate caused by heat is restrained to the minimum.

The present invention comprises the first step in which crystalline Si film is produced by annealing, the second step in which the processing related to patterns for the Si film is performed and the third step in which the Si film is heated by strong light. Between the second and the third steps, insulating film used in the third process which absorbs no light (that is, transmits the strong light) may be formed on the Si film. The insulating film may be made of silicon nitride or silicon oxide. For irradiation performed in the third process, laser light may be used.

Visible light, especially light shorter than 0.5 μm in wavelength is absorbed well by intrinsic or substantially intrinsic amorphous silicon and can be converted to heat. In a process according to the present invention, light 0.5 to 4 μm in wavelength is used for irradiation. The light in the above-mentioned wavelength is absorbed effectively by intrinsic or substantially intrinsic crystallized silicon film (containing phosphorus or boron $10^{17}$ cm$^{-3}$ or less) and can be converted to heat. Extreme infrared rays 10 μm or more in wavelength are absorbed by a glass substrate and said substrate is heated, however, if most light are 4 μm or less in wavelength, glass is heated little. That is, light 0.5 to 4 μm in wavelength is required to crystallize the crystallized Si film further.

In the case where crystallization utilizing a metal element such as nickel which promotes the crystallization of the crystalline silicon is employed as the above-mentioned first step of the present invention to realize the crystallization at a temperature lower than the temperature of the normal solid phase crystal growth, the effect of the present invention is remarkable. For elements usable for the present invention with which crystallization is promoted, Fe, Co, Ni, Ru, Rh, Pd, Os, Ir and Pt belonging to the eighth family of elements may be used. Sc, Ti, V, Cr, Mn, Cu and Zn belonging to 3d elements may also be used. Further, it has been verified by experiments that Au and Ag also promote crystallization. Among the above-mentioned elements, it is Ni that has a remarkable effect and operations of TFT have been verified using crystalline silicon film crystallized with it.

It is observed that in Si film to which any of these metals is added, needle-shaped crystals grow not in the direction of film thickness but in the direction along the surface of a substrate. However, the overall surface is not crystallized evenly and amorphous areas or areas in which crystallinity is low to the same extent as amorphous areas are left between crystals.

As described above, in Si film to which any of these metal elements is added, crystals grow in the shape of a needle, however, they grow little laterally, that is, in the direction of their sides. The width of the above-mentioned needle-shaped crystals is approx. 0.5 to 3 times of the thickness of Si film. Therefore, in said amorphous areas, crystallization is not completed even by annealing for a long time. A problem that the characteristics of TFT are not enhanced fully if semiconductor with amorphous areas described above is used for TFT is found.

The third step according to the present invention especially contributes to promoting further crystallization of areas in which crystallinity is low between needle-shaped crystals like teeth of a comb by heating at a temperature of from 800 to 1300° C. (measured by bringing a thermo couple into contact with silicon). It is because crystals grow epitaxially in the direction of the sides of needle-shaped crystals and amorphous areas are crystallized.

The part except active elements, for example, the areas on which a thin film transistor (TFT) is formed, of a thin film Si semiconductor crystallized by annealing at a temperature of from 400 to 650° C., typically at from 500 to 600° C. is removed in the pattern transfer and etching process. Silicon film can be heated selectively to promote further crystallization by irradiating visible radiation or near infrared rays to crystalline areas scattered like islands in which needle-shaped crystals are grown laterally. At this time, as a glass substrate or the like absorb little infrared rays, annealing by light can be performed without heating to the extent that said glass substrate cannot be used industrially because of softening or shrinkage.

Especially, if a metal element which promotes crystallization is used in annealing, crystallization in the direction of the sides of needle-shaped crystals which is not enough so far is promoted and very dense crystalline semiconductor thin film can be produced. Embodiment 1 described below shows crystalline areas in Si film are increased according to the present invention, for example, using Raman spectroscopy.

Embodiments 2 to 4 show examples of processes in which TFT is manufactured according to the present invention.

A method of fabricating a semiconductor device in accordance with another aspect of the present invention comprises:

forming a non-monocrystal silicon film containing a catalytic element therein on a substrate;

crystallizing the non-monocrystal silicon film by thermal annealing;

forming a pattern of the non-monocrystal silicon fil in the shape of an island;

promoting crystallization of the non-monocrystal silicon film by radiating a light thereto;

forming a gate electrode on the pattern;

introducing an impurity into the pattern with the gate electrode as a mask; and activating the impurity by heating.

BRIEF DESCRIPTION OF THE DRAWINGS

FIG. 4 shows the result measured by Raman spectroscopy of an Si film produced according to embodiment 1.

DETAILED DESCRIPTION OF THE PREFERRED EMBODIMENTS

Figure 1A:
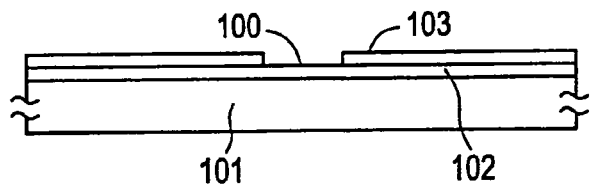
FIGS. 1(A) to 1(E) show the manufacturing process of a TFT according to embodiments 1 and 2.
Figure 1B:
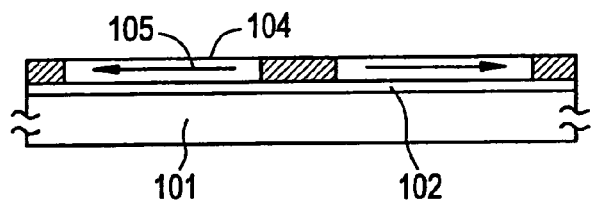
Figure 1C:
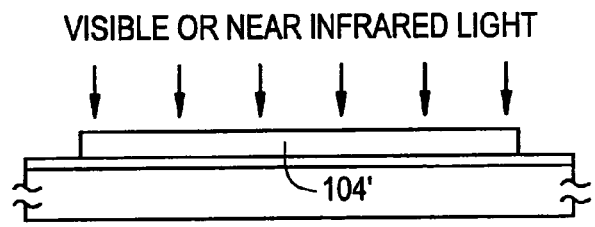
Figure 1D:
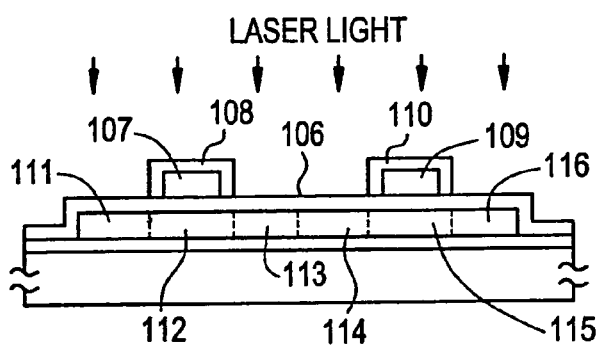
Figure 1E:
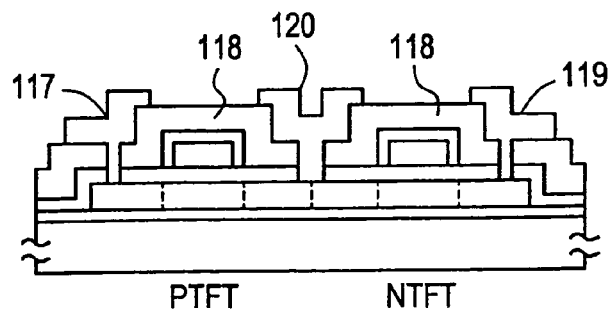
Figure 2A:
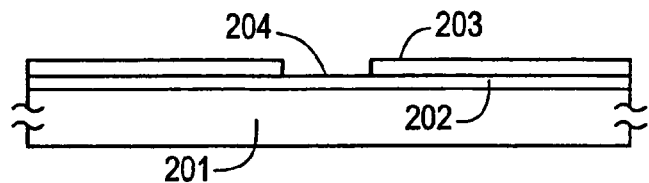
FIGS. 2(A) to 2(E) show the manufacturing process of a TFT according to embodiment 3.
Figure 2B:
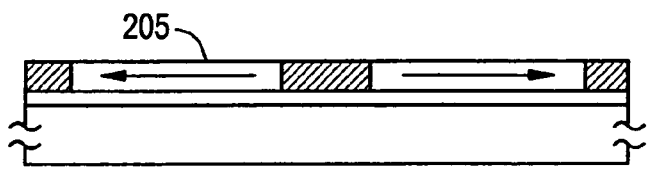
Figure 2C:
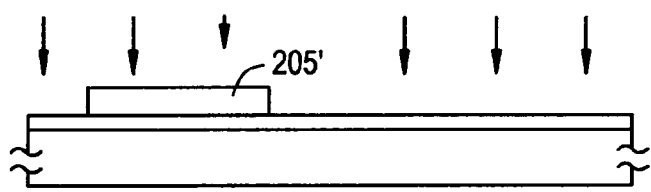
Figure 2D:
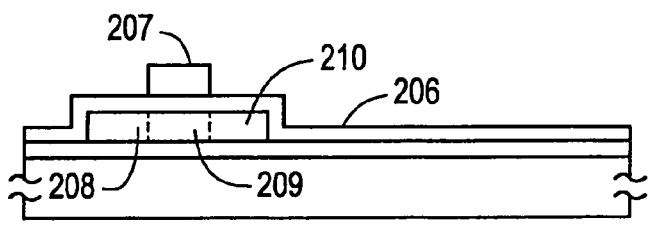
Figure 2E:
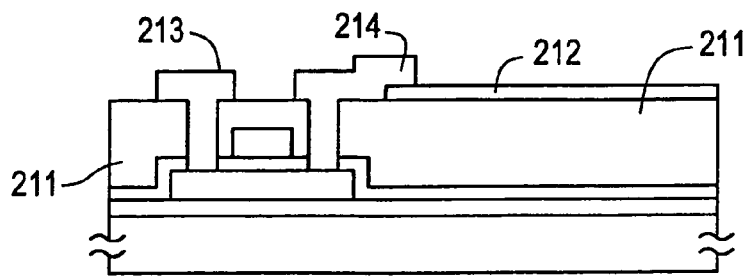

Embodiment 1 relates to improvement of crystallinity of Si thin film formed on a glass substrate. Description will be given, referring to FIGS. 1(A) to (C). First, a silicon oxide underfilm 102 with a thickness of 2000 Å is formed on a substrate 101 (No. 7059 manufactured by Corning Inc.) by sputtering. Next, a metal mask or a mask made of silicon oxide or silicon nitride film is provided (103). At the slits of said mask 103, said underfilm 102 is exposed. That is, when the condition shown in FIG. 1(A) is seen from above, said underfilm 102 is exposed at said slits and the other part is masked. After the mask 103 is provided, nickel film with a thickness of from 5 to 200 Å, for example, with a thickness of 20 Å is selectively deposited on an area shown as 100 by sputtering. Nickel is introduced into said area 100 selectively. (FIG. 1(A))

Next, the mask 103 is removed. Intrinsic (type I) amorphous Si film 104 with a thickness of from 300 to 1500 Å, for example, with a thickness of 800 Å is deposited by plasma CVD.

Then, said intrinsic amorphous Si film is crystallized by annealing in a nitrogen inactivated atmosphere (under atmospheric pressure) at a temperature of 550° C. for 8 hours or at 600° C. for 4 hours. In said area 100 in which nickel film is deposited selectively, said crystalline Si film 104 is crystallized perpendicularly to said substrate 101. As shown by an arrow 105, growth of crystals proceeds laterally (in parallel with said substrate) from said area 100 in the areas except said area 100. (FIG. 1(B))

After this process, the Si film is photoengraved and etched by from 10 to 1000 µm. Many island Si films 104' are formed on the substrate by the pattern transfer and etching process in dimensions of 100 µm square. Visible light or near infrared rays with a peak at 0.5 to 4 µm, 0.8 to 1.4 µm in this process or laser light are irradiated for from 30 to 600 seconds to promote crystallization of said Si film 104'. (FIG. 1(C)), For a light source of infrared rays, a halogen lamp is used. The intensity of visible light and near infrared rays is adjusted so that the temperature on monocrystal silicon wafer sent from a monitor may be from 800 to 1300° C., typically from 900 to 1200° C. Specifically, the temperature of a thermocouple embedded in Si wafer is monitored and the values are fed back to the light source of infrared rays.

Figure 5A:
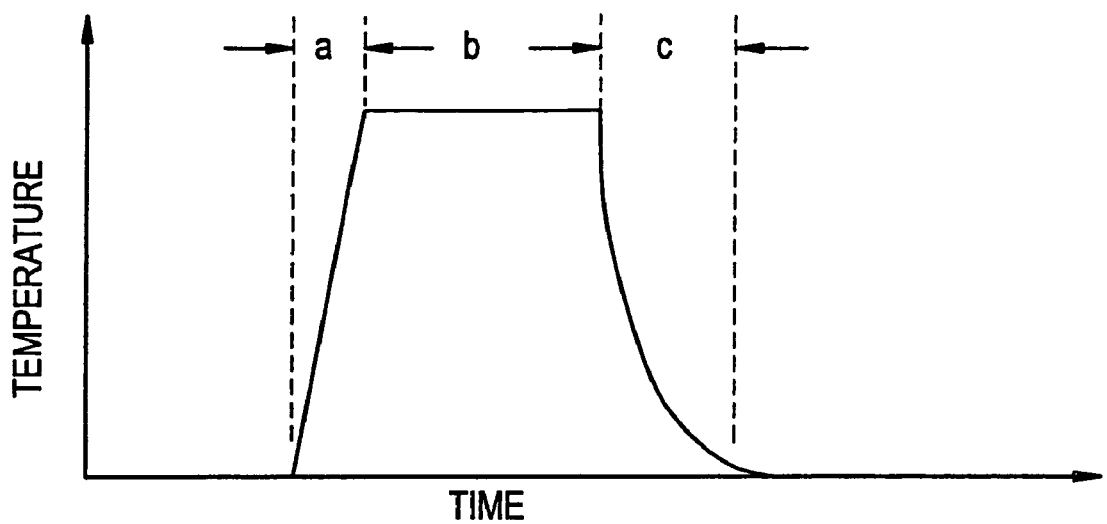
FIGS. 5(A) and 5(B) show examples of a temperature setting in embodiment 1.

In embodiment 1, the temperature is raised or lowered as shown in FIGS. 5(A) and (B). The temperature is raised at a constant rate of 50 to 200° C./sec. and is lowered at a speed of 20 to 100° C./sec. by natural cooling.

FIG. 5(A) shows a normal temperature cycle consisting of three processes of temperature raising time 'a', holding time 'b' and lowering time 'c'. However, in such a case, as a substrate is heated or cooled rapidly from the room temperature to high temperature of 1000° C., then from high to room temperature, the variation has a significant effect on the Si film and the substrate and the Si film is often peeled.

Figure 5B:
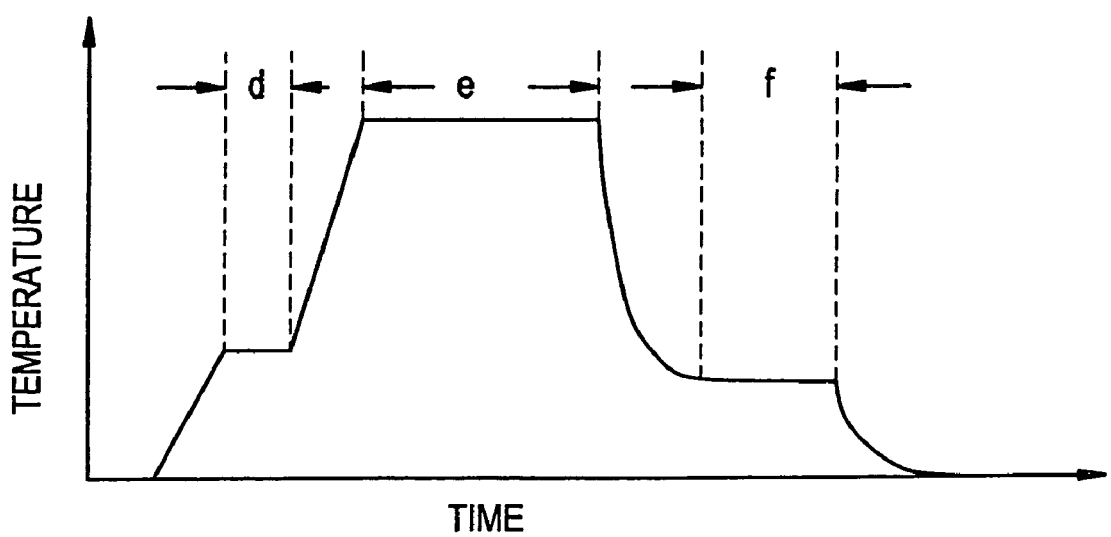

To solve this problem, as shown in FIG. 5(B), preheating time 'd' and post-heating time 'f' are specified and it is desirable that a substrate is held to the temperature of from 200 to 500° C. before the holding time such that it does not have a significant effect on said substrate and the films.

It is preferable that when irradiating infrared rays, silicon oxide or silicon nitride film is formed on said substrate as protective film. It is because the condition of the surface of Si film 104 is kept better. Therefore, said protective film is formed in an atmosphere of $H_2$. Compound of HCl of 0.1 to 10%, hydrogen halide, fluorine, chlorine and bromine may be mingled in said atmosphere of $H_2$.

As irradiation of visible light and near infrared rays is performed selectively on crystallized Si film, heating for a glass substrate can be restrained to the minimum. The way is very effective to reduce defects or dangling bonds in Si film. It is also important that visible light or near infrared rays are irradiated after the crystallized process by heating. If infrared rays are irradiated on amorphous Si film suddenly without crystallizing by annealing beforehand, good crystals cannot be produced.

FIG. 4 shows the Raman spectrum of crystalline Si film produced according to embodiment 1. "c-Si" shows the intensity of the Raman scattering of a monocrystal silicon wafer measured as a reference sample. "1100° C., 180 sec" in FIG. 4 means the temperature at which infrared rays are irradiated is 1100° C. and they are irradiated for 180 seconds. As the drawing shows, the intensity of Raman scattering increases by irradiation of infrared rays, however, it shows the volume percentage of crystals increases. In this way, areas in which crystallization is not enough are crystallized by irradiating infrared rays.

Embodiment 2 describes the process of forming a complementary circuit of a P-channel TFT (PTFT) and N-channel TFT (NTFT) using crystalline Si film formed on a glass substrate shown in FIGS. 1(A) to (E). The configuration of embodiment 2 can be utilized for the switching element for electrodes for pixels of an active LCD, the peripheral driver circuit, further, an image sensor and an integrated circuit.

FIG. 1 shows a cross-sectional view of a process according to embodiment 2. First, silicon oxide underfilm 102 with a thickness of 2000 Å is deposited on a substrate 101 (No. 7059 manufactured by Corning Inc.) by sputtering. When said substrate is cooled up to the temperature at which distortion occurs (called the distortion temperature hereinafter) or lower at 0.1 to 1.0° C./min after the substrate is annealed at a temperature higher than the distortion temperature before or after deposition of the underfilm, shrinkage of said substrate in the later process (containing irradiation of infrared rays according to the present invention) in which the temperature of said substrate rises is reduced and mask alignment is simplified. It is desirable that after a No. 7059 substrate manufactured by Corning Inc. is annealed at a temperature of from 620 to 660° C. for 1 to 4 hours, it is cooled at 0.1 to 1.0° C./min., preferably 0.1 to 0.3° C./min. and is taken out when the temperature falls to 450 to 590° C.

After deposition of said underfilm, a mask 103 formed by Si Nitride film and so on is provided. The underfilm 102 is exposed through the slits of the mask 103. That is, when the condition shown in FIG. 1(A) is seen from upwards, the underfilm 102 is exposed through the slits of said mask and other parts are masked. After the mask 103 is provided, nickel silicide film (chemical formula: $NiSi_x$, $0.4<x<2.5$, for example, x=2.0) with a thickness of from 5 to 200 Å, for example, with a thickness of 20 Å is deposited selectively in an area 100 by sputtering. Nickel is introduced selectively in the area 100. (FIG. 1(A))

Next, the mask 103 is removed and intrinsic (type I) amorphous Si film 104 with a thickness of from 300 to 1500 Å, for example, with a thickness of 500 Å is deposited by plasma CVD. The amorphous Si film is crystallized by annealing at 550° C. in an inactivated atmosphere (containing nitrogen or argon under air pressure) for 4 to 8 hours. At this time, in said area 100 in which nickel silicide film is selectively deposited, crystallization of crystalline Si film 104 in the perpendicular direction to said substrate 101 is promoted. In areas other than said area 100, growth of crystals is promoted laterally (in parallel with said substrate) from said area 100 as shown by an arrow 105. (FIG. 1(B))

After the above-mentioned process, a pattern is provided on said Si film and active layers 104' scattered like islands of TFT are formed. At this time, it is important to specify so that no leading edge of growth of crystals, which, that is, is the boundary between an crystalline Si area and an amorphous Si area and in which nickel is contained in high density, exists. In this way, it is enabled that carriers transferring between a source and a drain are not influenced by nickel in a channel forming area. The dimensions of an active layer 104' are specified in consideration of the length and width of a channel of TFT. The smallest layer is a size of 50 μm×20 μm and the largest one is a size of 100 μm×1000 μm of said active layers.

Such active layers are formed on a substrate in large numbers. Crystallization of said active layers is further promoted by irradiating infrared rays or laser light with peaks at 0.5 to 4 μm, 0.8 to 1.4 μm according to this embodiment for 30 to 180 seconds. The temperature on said layer should be from 800 to 1300° C., typically from 900 to 1200° C. When infrared rays or laser light are irradiated in this embodiment, the temperature was 1100° C. To keep the condition of the surface of the active layers better, irradiation is performed in the atmosphere containing $H_2$. As in this process, active layers are selectively heated, heating on a glass substrate can be restrained to the minimum. The selective heating is very effective to reduce detects or dangling bond in active layers. (FIG. 1(C))

Next, a silicon oxide film 106 with a thickness of 1000 Å is deposited as a gate insulating film by plasma CVD. For the material gas used in chemical vapor deposition (CVD), tetraethoxysilane (TEOS, $Si(OC_2H_5)_4$) and oxygen are used and the temperature of the substrate during deposition should be from 300 to 550° C. The temperature of the substrate when Si oxide film is deposited in this embodiment was 400° C.

After deposition of the Si oxide film 106 which functions as a gate insulating film, annealing by irradiating visible light or near infrared rays is performed again. Owing to the annealing, a level on the interface between mainly Si oxide film 106 and Si film 104 and near it can be dissolved. The annealing is an extremely useful operation for an insulated gate field effect semiconductor device in which the characteristic of the interface between gate insulating film and a channel forming area is extremely important.

Continuously, aluminum (containing scandium by 0.01 to 0.02%) with a thickness of from 6000 to 8000 Å, for example, with a thickness of 6000 Å is deposited by sputtering. The aluminum film is pattern-transferred and etched, and gate electrodes 107 and 109 are formed. Further, the surfaces of said aluminum electrodes are anodized and oxide layers 108 and 110 are formed on the surfaces. The anodizing is performed in the solution of ethylene glycol containing tartaric acid by 1 to 5%. The thickness of the oxide layers 108 and 110 is 2000 Å. As the thickness of the oxide layers 108 and 110 is the thickness in which an offset gate area is formed in the later ion implantation process, the length of said offset gate area can be determined in said anodizing process.

Next, by ion implantation (also called plasma doping), impurities to which P or N conductive type is imparted are introduced into an active layer area (comprising a source, a drain and a channel) using a gate electrode 107 and the peripheral oxide layer 108, and a gate electrode 109 and the peripheral oxide layer 110 as masks. For the doping gas, phosphine ($PH_3$) and diborane ($B_2H_6$) are used. In the case of the former, the accelerating voltage should be from 60 to 90 kV and for instance 80 kV was used. In the case of the latter, it should be from 40 to 80 kV and for instance 65 kV was used. The dose should be $1\times10^{15}$ to $8\times10^{15}$ cm$^{-2}$, for instance phosphorus is doped to $2\times10^{15}$ cm$^{-2}$ and boron is doped to $5\times10^{15}$ cm$^{-2}$. In doping, by masking one area with photoresist, each element is selectively doped. As a result, an N-type dopant area 114 and 116, and a P-type dopant area 111 and 113 are formed. It means that the area for P-channel TFT (PTFT) and the area for N-channel TFT (NTFT) are formed.

Then, annealing is performed by irradiation of laser light. For laser light, KrF excimer laser of which the wavelength is 248 nm and pulse width is 20 nsec. is used, however, other lasers may be used. For the condition of irradiating laser light, the density of energy should be from 200 to 400 mJ/cm$^2$ and for instance 250 mJ/cm$^2$ is used. For the number of shots of the laser irradiation, it should be 2 to 10 per one place and for instance two shots are employed. A substrate may be heated at approx. from 200 to 450° C. when irradiating said laser light to enhance the effect. (FIG. 1(D)).

In the process, lamp annealing by visible light or near infrared rays may also be performed. Visible light or near infrared rays are absorbed readily into crystallized silicon or amorphous silicon to which phosphorus or boron is added to $10^{19}$ to $10^{21}$ cm$^{-3}$ and effective annealing equivalent to annealing at a temperature of 1000 ° C. or more can be performed. If phosphorus or boron is added, even near infrared rays are absorbed fully by impurity scattering. This can also be seen even by observation with naked eyes because it is black. On the other hand, visible light or near infrared rays are little absorbed into a glass substrate. As a glass substrate is heated only for a short time and is not heated to high temperature and only for a short time, the above-mentioned lamp annealing is the most suitable method for a process in which shrinkage of a glass substrate occurs.

Continuously, silicon oxide film 118 with a thickness of 6000 Å is deposited as an interlayer insulator by plasma CVD. For said interlayer insulator, polyimide or two-layer film made of silicon oxide and polyimide may be used. Further, an electric contact hole is formed and electrodes and wiring 117, 120 and 119 of TFT are formed by metal material, for example, multilayer film of titanium nitride and aluminum. At last, annealing is performed in an atmosphere of hydrogen under one atmospheric pressure at a temperature of 350° C. for 30 minutes and a TFT complementary semiconductor circuit is completed. (FIG. 1(E))

Especially, in this invention, it is important that dangling bounds caused in the process of light annealing by visible light or near infrared rays are neutralized by heating them at a temperature of from 250 to 400° C. in the atmosphere of hydrogen in a later process.

The above-mentioned circuit is CMOS. In said process, two TFTs may be formed at the same time and independent two TFTs may be formed at the same time by cutting them in the center.

In embodiment 2, as the method by which Ni is doped, the method by which Ni film (as it is very thin, it cannot be observed as film.) is selectively deposited on underfilm 102 under amorphous Si film 104 and growth of crystals is performed from here is adopted. However, after amorphous Si film 104 is formed, nickel silicide film may be selectively deposited. That is, growth of crystals may be performed from the upper face of amorphous Si film and from the lower face. The method by which amorphous Si film is deposited beforehand and nickel ions are doped into said amorphous Si film 104 selectively by ion implantation may be adopted. The above-mentioned method has a characteristic that the density of nickel element can be controlled in detail. Ni may be doped by plasma-assisted chemical vapor deposition (PCVD) or by CVD.

Embodiment 3 relates to the case in which in an active LCD, N-channel TFTs are provided for each pixel as a switching element. The case of one pixel will be described, however, a large number (generally some hundred thousand) of other pixels are formed in the same structure. Of course, a P-channel TFT may be used as a switching element instead of a N-channel TFT. A N-channel or P-channel TFT can be used for a peripheral circuit instead of pixel of LCD and for an image sensor and other devices. That is, a TFT which can be used as a thin film transistor may be used for any purpose.

FIG. 2 shows an outline of a process according to embodiment 3. In embodiment 3, for a substrate 201, No. 7059 glass substrate manufactured by Corning Inc. (thickness: 1.1 mm, 300×400 mm) is used. First, an underfilm 202 made of silicon oxide is deposited to a thickness of 2000 Å by plasma CVD. For the material gas used for CVD, TEOS and oxygen are used. Then, to dope nickel selectively, a mask 203 made of Si nitride film is formed and nickel film is deposited by sputtering to a thickness of from 5 to 200 Å, for instance, 20 Å. As described above, nickel film is formed in an area 204 selectively. (FIG. 2(A))

Then, an amorphous Si film 205 is deposited to a thickness of 100 Å by low-pressure chemical vapor deposition (LPCVD) or by plasma CVD. After dehydrogenation is performed at a temperature of 450° C. for one hour, the amorphous Si film is crystallized by annealing. Annealing is continued in an atmosphere of nitrogen at a temperature of 550° C. for 8 hours. As a nickel film is formed in an area 204 under the amorphous Si film 205 in this annealing, crystallization occurs from here. In said crystallization, in an area 204 in which nickel film is formed, silicon crystals grow perpendicularly to said substrate 201. As shown by an arrow in FIG. 2(B), in an area in which nickel film is not formed (areas 205), crystals grow in the parallel direction with said substrate. (FIG. 2(B))

After the annealing process, the crystallized silicon film is patterned to leave only active layers 205' for TFT in the form of islands and the rest is removed. At this time, it is important that no leading edges of growing crystals exist in an active layer, above all, an area in which a channel is formed. In the concrete, it is desirable that of the silicon film 205 shown in FIG. 2(B), at least the leading edges of crystallization and an area 204 in which nickel is doped are etched and that the intermediate part of the crystalline Si film 205 in which crystals grow in parallel with said substrate is used as an active layer. It is to prevent nickel contained at said leading edges collectively from having a bad effect on the characteristics of the TFT because nickel is contained at the leading edges of the growing crystals and in an area in which it is doped collectively. Visible or near infrared radiation are irradiated on said active layers in the form of islands 205' and they are annealed by light at a temperature of 1100° C. for 30 seconds. Laser light may be used instead of near infrared rays. (FIG. 2(C))

A silicon oxide gate insulating film (thickness: from 70 to 120 nm, typically 120 nm) 206 is formed of tetraethoxysilane (TEOS) by plasma CVD in an atmosphere of oxygen. The temperature of the surface of the substrate at that time is 350° C. Next, the film which mainly contains well-known polycrystalline silicon is formed by CVD and gate electrodes 207 are formed by pattern transfer and etching. Phosphorus as dopant is added by 0.1 to 5% to said polycrystalline silicon to enhance conductivity.

Then, phosphorus as an N-type dopant is doped by ion implantation and the source area 208, the channel forming area 20 9 and the drain area 210 are formed in self-aligning manner. By irradiating KrF laser light, the crystallinity of silicon film of which crystallinity deteriorates due to ion implantation is improved. The density of energy of the laser light at this time is 250 to 300 mJ/cm$^2$. By laser irradiation, the sheet resistivity of TFT source or drain amounts to 300 to 800 $\Omega$/cm$^2$. Lamp annealing by visible or near infrared radiation may be used for this process. (FIG. 2(D))

Then, a layer insulator 211 is formed by silicon oxide or polyimide and further, an electrode for pixel 212 is formed by ITO. An electric contact hole is formed and electrodes 213 and 214 are formed of chromium or aluminum multilayer film in the source or drain area of TFT. One electrode 214 is also connected to ITO 212. At last, the substrate which passes all the above-described processes is annealed in hydrogen at a temperature of from 200 to 400° C. for two hours and hydrogenated. As a result, a TFT is completed. This process is also performed in many other pixel areas at the same time. To enhance moisture resistance, passivation film may be formed of silicon nitride on the whole of the surface of the substrate. (FIG. 2(E))

Since a crystalline silicon film which has undergone crystal growth in a direction of carrier movement is used as an active layer comprising source, drain and channel forming areas in the TFT manufactured in the present embodiment, carriers do not cross the grain boundary, that is, carriers move along the crystal grain boundaries of the needle-shaped crystal. Therefore, TFT having a high carrier mobility can be obtained. The TFT produced in embodiment 3 is N-channel type and the mobility is from 90 to 130 (cm$^2$/Vs). Compared with the mobility of from 50 to 70 (cm$^2$/Vs) of the prior N-channel TFT which uses crystalline silicon film obtained by crystallization by annealing at a temperature of 600° C. for 48 hours, the above-mentioned N-channel TFT is provided with much enhanced characteristics. If annealing by irradiation of visible or near infrared radiation, or laser light is not performed, the mobility is substantially low and on-off ratio is also low. This reveals that the crystallization promoting process by irradiation of intense or laser light is useful to enhance the reliability of the TFT.

Referring to FIG. 3, embodiment 4 will be described. First, an underfilm 302 is formed on a glass substrate 301 and further, an amorphous silicon film 304 with a thickness of 300 to 800 Å is deposited by plasma CVD. Nickel film is formed in an area shown by 300 using a mask 303 of silicon oxide with a thickness of 1000 Å as embodiment 1. Next, the above-mentioned substrate is annealed at a temperature of 550° C. for 8 hours to crystallize the silicon film 304. At this time, crystals grow in parallel with the substrate as shown by an arrow 305. (FIG. 3(A))

Figure 3A:
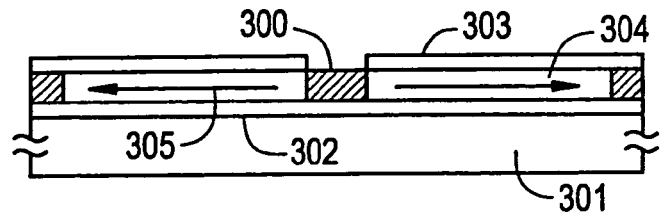
FIGS. 3(A) to 3(E) show the manufacturing process of a TFT according to embodiment 4.
Figure 3B:
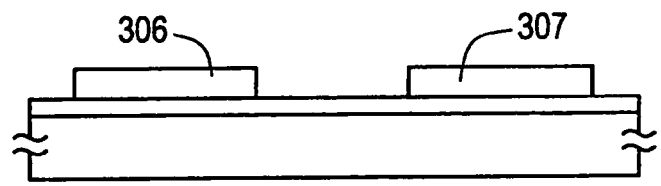
Figure 3C:
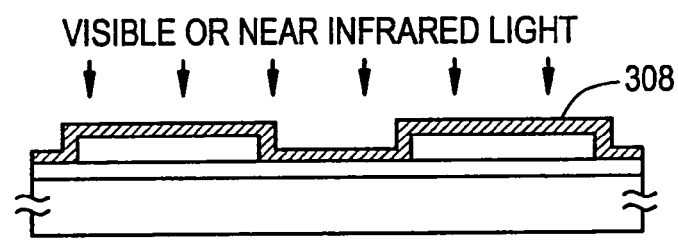
Figure 3D:
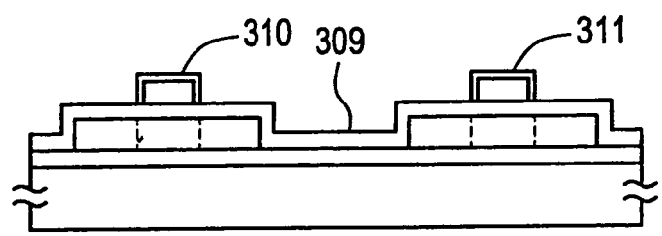
Figure 3E:
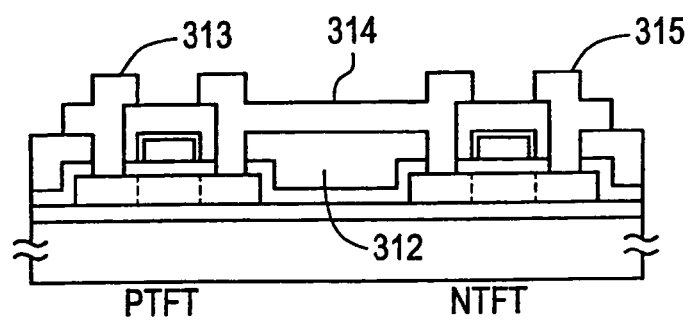

Next, active layer areas like islands 306 and 307 are formed by transferring a pattern on silicon film 304 and etching said film. At this time, the area shown by 300 in FIG. 3(A) is the one in which nickel is doped directly and contained in high density. At the end of crystal growth as described in embodiments 2 and 3, nickel is also contained in high density. It is proven that in these areas, the density of nickel is higher near one digit, compared with crystallized areas between the above-mentioned areas.

Therefore, in this embodiment, active elements, for example, active layer areas 306 and 307 being the areas to form TFT are formed by transferring a pattern on areas other than the ones in which density of nickel is high and etching. That is, the areas in which Ni is contained in high density are excluded intentionally. Active layers are etched by the reactive ion etch (RIE) having anisotropy in the perpendicular direction. The density of nickel in active layers in this embodiment is approx. $1 \times 10^{17}$ to $1 \times 10^{19}$ cm$^{-3}$. (FIG. 3(B))

In this embodiment, a complementary TFT circuit is obtained using active layers 306 and 307. That is, in that in the circuit in this embodiment, PTFT and NTFT are separated, said circuit is different form that shown in FIG. 1(D) of embodiment 2. That is, in the configuration shown in FIG. 1(D), the active layers of two TFTs are connected and in the intermediate areas nickel is contained in high density. However, this embodiment has a characteristic that the density of nickel is low at any part. Therefore, stability of operation is enhanced.

Next, silicon oxide or silicon nitride film 308 with a thickness of from 200 to 3000 Å is deposited by plasma CVD. As in embodiment 2, lamp annealing by irradiation of visible or near infrared radiation, or laser light is performed. The conditions are the same as embodiment 3. In this embodiment, when visible or near infrared radiation, or laser light are irradiated, protective film of silicon oxide or silicon nitride is formed on the surface of active layers and therefore roughness or contamination on the surface caused by irradiation of infrared radiation or laser light can be prevented. (FIG. 3(C))

After irradiation of visible or near infrared radiation, or laser light, said protective film 308 is removed. Then, gate insulating film 309, gate electrodes 310 and 311 are formed as in embodiment 2 (FIG. 3(D)) and interlayer insulator 312, an electric contact hole in said interlayer insulator and metal wiring 313, 314 and 315 are formed. (FIG. 3(E))

As described above, a complementary TFT circuit is formed. In this embodiment, a protective film on the surface of active layers is formed when visible or near infrared radiation, or laser light are irradiated to prevent roughness and contamination on the surface. The characteristics (mobility in electrical field and threshold voltage) and reliability in this embodiment are extremely good.

Embodiment 5 relates to the complementary circuit of P-channel TFT (PTFT) and N-channel TFT (NTFT) using crystalline silicon film formed on a glass substrate. The above-mentioned configuration in this embodiment can be used for a switching element for a pixel electrode and a peripheral driver circuit of an active liquid crystal display, an image sensor and an integrated circuit.

FIG. 6 shows a cross section of a semiconductor device according to a process in embodiment 5. First, silicon oxide underfilm 402 with a thickness of 2000 Å is deposited on a No. 7059 substrate manufactured by Corning Inc. 401 by sputtering. When said substrate is cooled to lower than the temperature at which distortion occurs on said substrate (called distortion temperature hereinafter) at from 0.1 to 1.0 degree/min. after said substrate is annealed at higher temperature than the distortion temperature before or after deposition of said underfilm, said substrate rarely shrinks in a later process in which rise of temperature occurs (containing irradiation of near infrared radiation according to the present invention) and mask alignment is easier. In the case of a No. 7059 substrate manufactured by Corning Inc., it is desirable that after it is annealed at a temperature of 620 to 660° C. for 1 to 4 hours, it is cooled at from 0.1 to 1.0 degree/min., preferably at from 0.1 to 0.3 degree/min. and when the temperature of said substrate falls to 450 to 590° C., it is taken out.

Figure 6A:
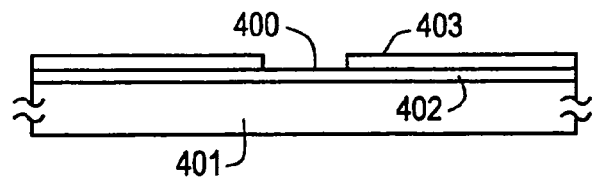
FIGS. 6(A) to 6(E) show the manufacturing process of a TFT according to embodiment 5.
Figure 6B:
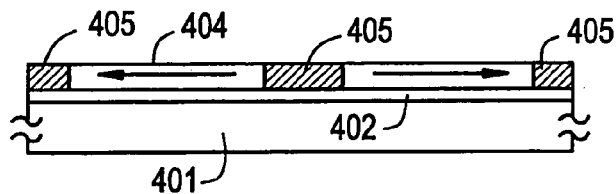
Figure 6C:
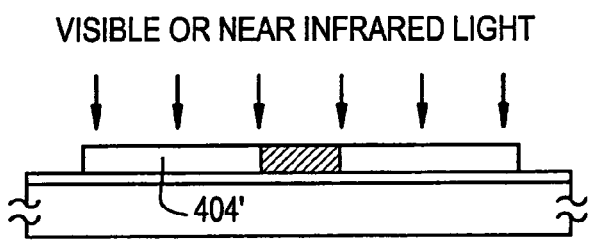
Figure 6D:
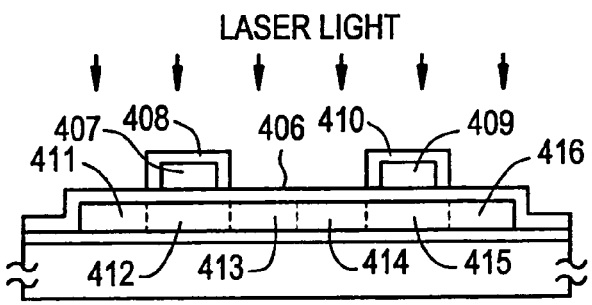
Figure 6E:
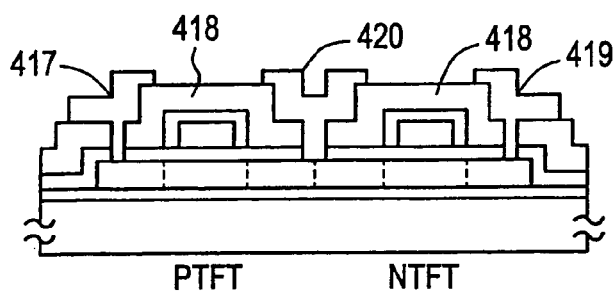

After the underfilm is deposited, a mask 403 of silicon nitride film and so on is formed. The underfilm 402 is exposed through the slits of the mask 403. That is, when the condition shown in FIG. 6(A) is seen from upwards, the underfilm 402 is exposed in slits and other parts are masked. After said mask 403 is formed, a nickel film with a thickness of 5 to 200 Å, for instance, with a thickness of 20 Å is deposited in an area shown by 400 selectively. In this condition, nickel is to be doped selectively in said area 400. (FIG. 6(A))

Next, said mask 403 is removed and intrinsic (type I) amorphous silicon film 404 with a thickness of 300 to 1500 Å, for instance with a thickness of 500 Å is deposited by plasma-assisted CVD. The above-mentioned substrate is annealed in an inactivated atmosphere (containing nitrogen or argon, under atmospheric pressure) at 550° C. for 4 to 8 hours to crystallize said amorphous silicon film. At this time, in said area 400 in which nickel film is deposited selectively, crystallization of crystalline silicon film 404 is promoted perpendicularly to said substrate 401. In areas other than said area 400, crystal growth is promoted laterally (in the parallel direction with said substrate) from said area 400 as shown by an arrow. It is proven that the density of nickel is high in an area in which nickel is doped first or an area in which the edge of crystallization exists (shaded part 405 in FIG. 6) by analysis by SIMS and TEM. (FIG. 6(B))

After this process, a pattern is transferred on silicon film and active layers 404' of TFTs in the form of islands are formed.

At this time, it is important that no edge of crystal growth (that is, the boundary between crystalline Si areas and amorphous Si areas in which the density of nickel is high) exists in the part to be a channel forming area. Such specification enables reduction of the effects of the nickel element upon carriers transferring between the source and drain in said channel forming area. The size of an active layer 404' is specified in consideration of the length and width of a channel of TFT. In the case of small one, a size of 50 µm×20 µm and in the case of large one, a size of 100 µm×1000 µm.

Such active layers are formed on said substrate in large numbers. Visible or near infrared radiation with peaks at 0.5 to 4 µm, for instance, 0.8 to 1.4 µm are irradiated on said substrate put in the atmosphere of hydrogen containing hydrogen chloride to 10 to 90%, for instance, 30% for 30 to 180 seconds. Instead of said hydrogen chloride, carbon tetrachloride, silicon tetrachloride, nitrogen trifluoride and dicarbon hexafluoride may be used.

As a light source of visible or near infrared radiation, a halogen lamp is used. The intensity of visible or near infrared radiation is adjusted so that the temperature of the surface of a monocrystal silicon wafer sent by a monitor is between 800 and 1300° C., typically between 900 and 1200° C. Specifically, the temperature of a thermocouple embedded in the silicon wafer is monitored and fed back to a light source of infrared radiation. In this embodiment, the temperature is raised or lowered as shown in FIG. 5(A) or (B). The rate of temperature increase is kept constant so that it rises at 50 to 200° C./sec. The temperature falls at 20 to 100° C. because of natural cooling.

FIG. 5(A) shows general cycles of the temperature comprising three steps of rising time a, holding time b and lowering time c. However, as in this case, said substrate is heated from room temperature to a high temperature of 1000° C. or cooled from the high temperature to room temperature rapidly, such rapid rise or fall of temperature has a significant effect on the silicon film or said substrate and said silicon film may be peeled.

To solve such a problem, it is desirable that the preheat time 'd' and the postheat time 'f' are specified and said substrate or film is held at a temperature which does not have a significant effect on it of from 200 to 500° C. before the temperature reaches said holding time.

As irradiation of such visible or near infrared radiation heats crystallized silicon film selectively, heating on a glass substrate can be restrained to the minimum. As such irradiation is performed in the ambient atmosphere containing hydrogen, the above-mentioned specification is very effective to reduce defects or dangling bond in silicon film. After irradiation of visible or near infrared radiation, silicon film is cleaned in pure water.

In such a way, nickel contained in active layers like islands 404' is removed. According to SIMS data, if such irradiation of visible or near infrared radiation is not performed, the density of nickel in a channel forming area of TFT is $5 \times 10^{18}$ cm$^{-3}$ or more. However, in this embodiment, by irradiation of visible or near infrared radiation, the density is restrained up to $1 \times 10^{18}$ cm$^{-3}$ (limitation of measurement) or less.

After this process, pattern transfer and etching is performed on silicon film in the size of from 10 to 1000 μm. For instance, pattern transfer is performed in the size of 100 μm square and many Si films in the form of islands 404' are formed on said substrate. Then, visible or near infrared radiation with peaks at 0.5 to 4 μm, for instance, 0.8 to 1.4 μm is irradiated on said substrate for 30 to 600 seconds to promote crystallization of said Si films 404'. (FIG. 6(C))

Then, silicon oxide film 406 with a thickness of 1000 Å is deposited as gate insulating film by plasma-assisted CVD. For material gas for CVD, tetraethoxysilane (TEOS, Si(OC$_2$H$_5$)$_4$) and oxygen are used. The temperature of the substrate during deposition should be from 300 to 550° C. and for instance is 400° C.

After deposition of the silicon oxide film 406 which functions as a gate insulating film, said substrate may be annealed by irradiation of visible or near infrared radiation again. By such annealing by light, a level on the interface between silicon oxide film 406 and silicon film 404 and near it mainly can be extinguished. This is extremely useful for an insulated gate field-effect semiconductor device in which the characteristic of the interface between gate insulating film and a channel forming area is extremely important.

Next, aluminum (containing scandium by 0.01 to 0.2%) with a thickness of from 6000 to 8000 Å, for instance, a thickness of 6000 Å is deposited by sputtering. Pattern transfer and etching is performed on the aluminum film and gate electrodes 407 and 409 are formed. Further, the surfaces of the aluminum electrodes are anodized and oxide layers 408 and 410 are formed on the surfaces. The anodization is performed in the solution of ethylene glycol containing tartaric acid by 1 to 5%. The thickness of the formed oxide layers 408 and 410 is 2000 Å. As the oxide layers 408 and 410 are equivalent to the thickness of an offset gate area in a later process of ion implantation, the length of the offset gate area can be specified in the anodizing process.

Next, by ion implantation (also called plasma-assisted doping), dopant of P or N conductive type is doped in an active layer area (comprising the source/drain and channel). At that time, a gate electrode 407 and the peripheral oxide layer 408, and a gate electrode 409 and the peripheral oxide layer 410 function as a mask. For the doping gas, phosphine (PH$_3$) and diborane (B$_2$H$_6$) are used. In case of the former, the accelerating voltage should be 60 to 90 kV and for instance, is 80 kV. In case of the latter, the accelerating voltage should be from 40 to 80 kV and for instance, 65 kV. A dose should be $1 \times 10^{15}$ to $8 \times 10^{15}$ cm$^{-2}$, and for instance, a dose of phosphorus is $2 \times 10^{15}$ cm$^{-2}$ and a dose of boron is $5 \times 10^{15}$ cm$^{-2}$. In implantation, each element is doped selectively by depositing photoresist in one area. As a result, N-type dopant areas 414 and 416, and P-type dopant areas 411 and 413 are formed, and P-channel TFT (PTFT) area and N-channel TFT (NTFT) area can be formed.

Then, annealing by irradiation of laser light is performed. For laser light, KrF excimer laser (wavelength: 248 nm, pulse width: 20 nsec.) is used, however, other laser may be used. For the irradiating condition of laser light, the density of energy should be 200 to 400 mJ/cm$^2$ and for instance is 250 mJ/cm$^2$, and the number of shots should be 2 to 10 shots per a place and for instance two shots are used for irradiation. While the laser light is irradiated, the substrate may be heated so that it is approx. from 200 to 450° C. to enhance the effect. (FIG. 6(D))

For irradiation for annealing in this process, visible or near infrared radiation may be used instead of laser light. The visible or near infrared radiation is readily absorbed by crystallized silicon or amorphous silicon to which phosphorus or boron is added by $10^{19}$ to $10^{21}$ cm$^{-3}$. Therefore, effective annealing equivalent to annealing during which the temperature on the surface of a substrate is 1000° C. or more can be performed. When phosphorus or boron is added, even near infrared radiation is absorbed fully by impurity diffusion. On the other hand, as light is little absorbed by a glass substrate, said substrate is not heated to a high temperature. As annealing by light does not require a long time, it is the most suitable way in a process in which shrinkage of a glass substrate is a problem.

Next, silicon oxide film 418 with a thickness of 6000 Å is deposited as an interlayer insulator by plasma-assisted CVD. For an interlayer insulator, polyimide or a two-layer film of silicon oxide and polyimide may be used. Further, a contact hole is formed and electrodes and wirings of TFT 417, 420 and 419 are formed by metal material, for example, multilayer film of titanium nitride and aluminum. At last, annealing is performed in the ambient atmosphere containing hydrogen under one atmospheric pressure at a temperature of from 200 to 450° C., for instance, 350° C. for 30 minutes and a complementary semiconductor circuit of TFT is produced. (FIG. 6(E)).

In the present invention, it is especially important that dangling bond caused in the process of annealing by visible or near infrared radiation are neutralized by heating the substrate in an ambient atmosphere containing hydrogen at a temperature of from 250 to 400° C. in a later process.

The above-mentioned circuit is a complementary circuit (CMOS) of PTFT and NTFT, however, in the process, two TFTs are produced at the same time and two independent TFTs can be produced at the same time by cutting in the center.

For a method of doping nickel in this embodiment, nickel thin film, which cannot be observed as film because it is very thin, is formed selectively on the underfilm 402 under the amorphous silicon film 404 and the method in which crystal growth is performed from said nickel thin film is adopted. However, the method in which nickel film is selectively deposited after amorphous silicon film 404 is formed may be adopted. That is, crystal growth may be performed from the upper surface of amorphous silicon film and also from the lower surface. The method in which amorphous silicon film is deposited beforehand and by ion implantation, nickel ion is implanted selectively in said amorphous silicon film 404 may be adopted. This case has a characteristic that the density of a nickel element can be controlled strictly. Plasma-assisted CVD or CVD may be used.

Embodiment 6 relates to an N-channel TFT as a switching element provided for each pixel of an active LCD. Description of one pixel will be given below; however, many other (generally some hundred thousand pcs.) pixels with the same configuration are formed. Of course, a P-channel TFT may be used instead of a N-channel TFT. An N-channel TFT can also be provided for peripheral circuit area instead of for a pixel of a LCD. An N-channel TFT can also be used for an image sensor or other device. That is, if it is used as a thin film transistor, it may be used for any purpose.

FIG. 7 shows an outline of a process of embodiment 6. In embodiment 6, a No. 7059 glass substrate manufactured by Corning Inc. (thickness: 1.1 mm, 300×400 mm) is used as a substrate 501. First, an underfilm 502 (silicon oxide) is deposited to a thickness of 2000 Å by plasma-assisted CVD. For the material gas for CVD, TEOS and oxygen are used. Further, silicon film 505 with a thickness of from 300 to 1500 Å, for instance, with a thickness of 800 Å is deposited by LPCVD. To dope nickel selectively, a mask 503 is formed of silicon nitride film. A nickel film with a thickness of from 5 to 200 Å, for instance, with a thickness of 20 Å is deposited by sputtering. In such a way, in an area 504, silicon and nickel films are selectively contacted.

After said substrate is dehydrogenated at a temperature of 450° C. for one hour, it is crystallized by annealing. In this annealing process, the substrate is annealed in an ambient atmosphere containing nitrogen at a temperature of 600° C. for 4 hours. As in said annealing process, in an area 504 on amorphous silicon film 505, nickel film is formed, crystallization occurs in said area. In crystallization, in an area in which nickel is not formed (areas other than said area 504), crystal growth is promoted in parallel with said substrate as shown by an arrow in FIG. 7(B). An area 506 in which nickel is contained in high density is formed just under said area 504 and at the leading edge of crystallization. (FIG. 7(B))

After said annealing process, pattern transfer is performed on the crystallized silicon film, other areas are etched, leaving only an active layer 505' of TFT in the form of an island. At this time, it is important that the substrate is specified so that no leading edge of growing crystals exist in active layers, above all, in a channel forming area.

Figure 7A:
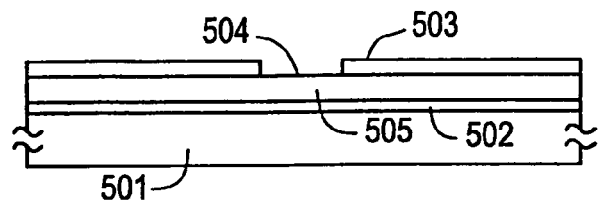
FIGS. 7(A) to 7(E) show the manufacturing process of a TFT according to embodiment 6.
Figure 7B:
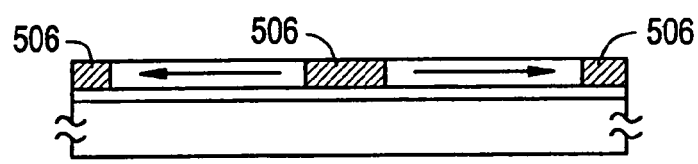
Figure 7C:
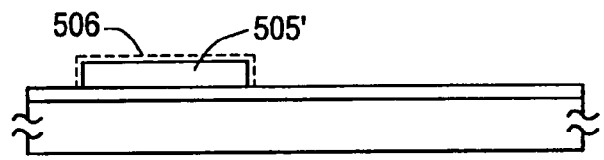
Figure 7D:
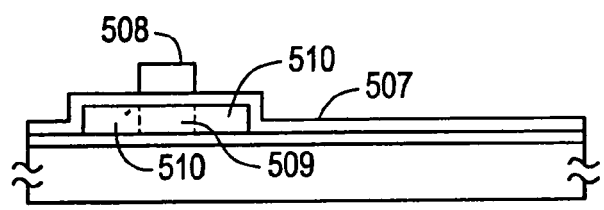
Figure 7E:
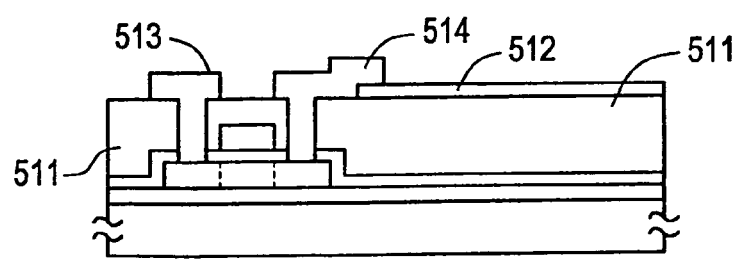
Figure 8A:
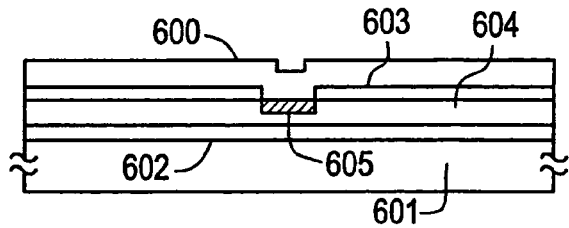
FIGS. 8(A) to 8(E) show the manufacturing process of a TFT according to embodiment 7.
Figure 8B:
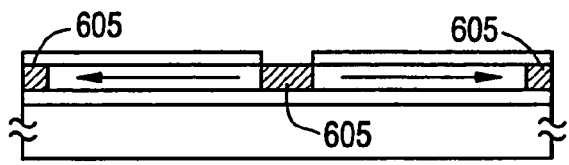
Figure 8C:
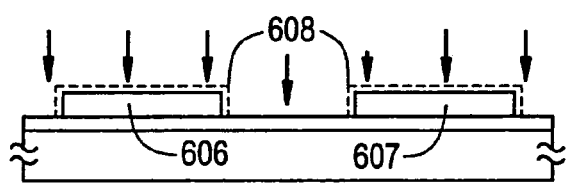
Figure 8D:
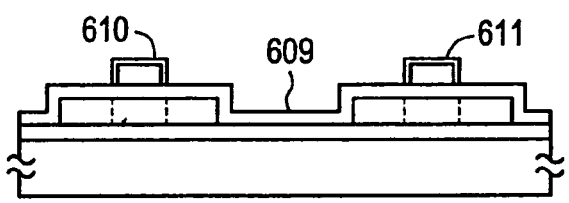
Figure 8E:
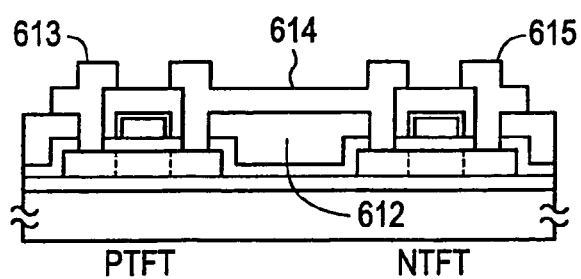
Figure 9A:
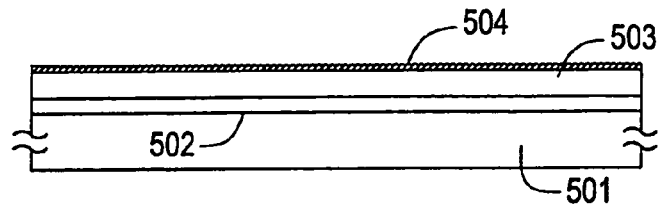
FIGS. 9(A) to 9(E) show the manufacturing process of a TFT according to embodiment 8.
Figure 9B:
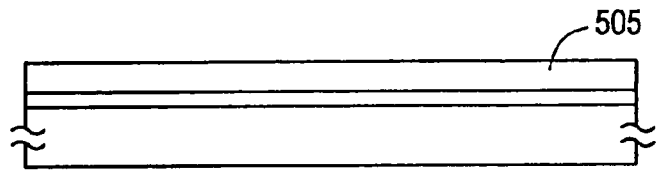
Figure 9C:
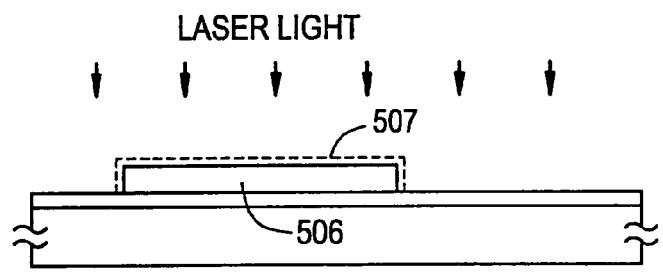
Figure 9D:
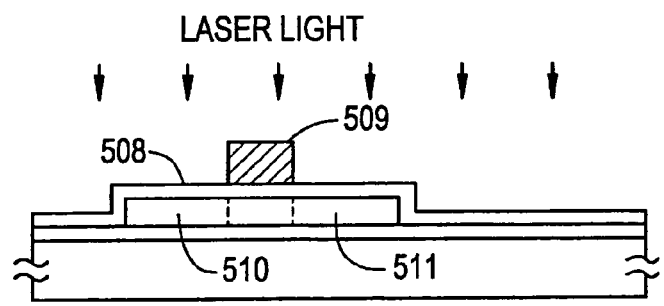
Figure 9E:
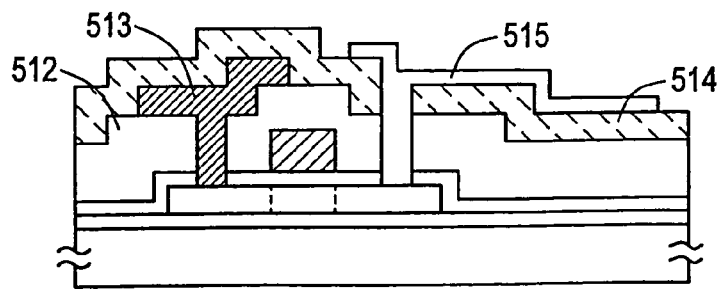

Specifically, it is desirable that of the silicon film 505 shown in FIG. 7(B), at least the leading edge of crystallization and the area 504 in which nickel is doped are etched and the intermediate part in which crystals grow in crystalline silicon film 505 in parallel with the substrate is used as an active layer. It is to prevent nickel contained in high density at the edge from having a adverse effects on the characteristics of the TFT because nickel is contained in high density at the leading edge of crystal growth and in the doped area.

Then, the substrate is put in a mixed gas of hydrogen chloride and oxygen (one atmospheric pressure, hydrogen chloride/oxygen=¼) and an active layer in the form of an island 505' is thermally oxidized at a temperature of from 550 to 650° C., for instance, 600° C. for one hour. Carbon tetrachloride, silicon tetrachloride, nitrogen trifluoride and dicarbon hexafluoride may be used instead of hydrogen chloride. As a result, a silicon oxide film 506 with a thickness of 100 Å is formed on the surface of the silicon film in the form of an island 505'. In such thermal annealing process, the pressure of the atmosphere may be adjusted to a suitable one and plasma may be generated by a microwave or radio frequency wave. (RF wave).

Then the substrate is dipped in buffer hydrofluoric solution (HF/NH$_4$F=1/10) which is a mixed solution of hydrofluoric acid and ammonium fluoride as a buffer solution for 3 to 7 seconds and silicon oxide film 506 is etched. A silicon oxide gate insulating film 507 with a thickness of from 70 to 120 nm (typically 120 nm) is formed of TEOS by plasma-assisted CVD in an ambient atmosphere containing oxygen. The temperature on the surface of the substrate is 350° C. Then, a film which mainly contains well-known polycrystal silicon is formed by CVD and a gate electrode 508 is formed by pattern transfer and etching on the polycrystal silicon. Phosphorus is doped to 0.1 to 5% of said polycrystal silicon as a dopant to enhance conductivity.

Then, as an N-type impurity, phosphorus is doped by ion implantation, and the source/drain area 510 and channel forming area 509 are formed in self-aligning manner. By irradiating KrF laser light, crystallization of silicon film in which crystallization is deteriorated due to ion implantation is improved. The energy density of the laser light should be from 250 to 300 mJ/cm$^2$. By irradiation of laser, the sheet resistance at the source/drain of TFT is 300 to 800 $\Omega$/cm$^2$. In this process, lamp annealing by visible or near infrared radiation may be performed. (FIG. 7(D))

Then, an interlayer insulator 511 is formed by silicon oxide or polyimide and further, an electrode for pixel 512 is formed by ITO. A contact hole is formed and electrodes 513 and 514 are formed of chrome/aluminum multilayer film in the source/drain area of the TFT. One electrode 514 is also connected to ITO 512. Finally, the substrate is annealed in hydrogen at a temperature of from 200 to 450° C., for instance 350° C. for one hour to hydrogenate it. After the above-mentioned processes, the TFT is completed. This process is also performed at the same time in many other pixel areas. A passivation film may be formed of silicon nitride on the overall surface to enhance moisture resistance. (FIG. 7(E))

For the TFT produced in this embodiment, crystalline silicon film where a crystal grows in the direction in which carriers transfer is used as an active layer comprising the source, channel formation and drain areas. Therefore, as no carriers cross a grain boundary, that is, carriers transfer along the grain boundary of a needle-shaped crystal, a TFT having a high carrier mobility can be produced. The TFT produced in this embodiment is N-channel type and the mobility is from 90 to 130 cm$^2$/Vs. Compared with the mobility of from 50 to 70 cm$^2$/Vs of the prior N-channel TFT using crystalline silicon film produced by crystallization by annealing at a temperature of 600° C. for 48 times, the mobility of from 90 to 130 in this embodiment reveals that the characteristic is enhanced. If after a process of crystallization by annealing at the temperature of 600° C., the substrate is not oxidized in an ambient atmosphere containing hydrogen chloride, substantially, the mobility is low and the on-off rate is also low. This is considered to be owing to the effect of removal of nickel in a process of depositing and etching oxide film and the effect of improvement of crystallization. It is proven that the process of irradiating intense light shown in this embodiment is useful for enhancing reliability of TFT.

Referring to FIG. 8, embodiment 7 will be described. First, an underfilm 602 is deposited on a glass substrate 601 by sputtering or by plasma-assisted CVD and then an amorphous silicon film 604 with a thickness of from 300 to 800 Å is deposited by plasma-assisted CVD. After a silicon oxide film 603 a thickness of 1000 Å is formed, selective pattern transfer and etching is performed on said Si oxide film. As a result, a part of amorphous silicon film 604 is exposed. A Nickel film 600 with a thickness of from 500 to 2000 Å, for instance with a thickness of 1000 Å is deposited on the part of amorphous silicon film by sputtering. Next, annealing in an ambient atmosphere containing nitrogen at a temperature of 450° C. for one hour is performed and a nickel silicide layer 605 is formed in a part of Si film in contact with nickel film 600. (FIG. 8(A))

Then, said nickel film is etched by nitric acid or a solution comprising nitric acid and acetic acid added to the nitric acid. Then, annealing in an ambient atmosphere containing nitrogen at a temperature of 550° C. for 8 hours is performed to crystallize silicon film 604. At this time, crystal growth is promoted in parallel with the substrate as shown by an arrow in FIG. 8. In the area in which nickel silicide is doped and in its vicinity and at the leading edge of crystallization, areas 605 in which nickel is contained in high density are formed. (FIG. 8(B))

Next, pattern transfer and etching is performed on said silicon film 604 and active layer areas in the form of islands 606 and 607 are formed. In the areas shown by 605 in FIG. 8(B), nickel is contained in high density. It is proven that in these areas, the density of nickel is higher near one digit than the area which is crystallized between the areas. Therefore, in this embodiment, for active elements, for example, active layer areas 606 and 607 being areas to form TFTs, pattern transfer is performed on areas other than areas in which nickel is contained in high density. The active layers are etched by the reactive ion etch (RIE) having anisotropy in the perpendicular direction. The density of nickel in the active layers in such a condition is approx. from $1\times10^{19}$ to $1\times10^{20}$ cm$^{-3}$.

In this embodiment, a complementary TFT circuit is produced using active layers 606 and 607. However, the configuration of the circuit in this embodiment is different from that shown in FIG. 6(D) related to embodiment 5 in that in the circuit in this embodiment, PTFT and NTFT are separated. That is, in the configuration shown in FIG. 6(D), two TFT active layers are connected and in the intermediate area, nickel is contained in high density. However, this embodiment has a characteristic that in any part, the density of nickel is low. However, further reduction of the density of nickel is required from the viewpoint of obtaining enough reliability.

Then, intense light is irradiated on the substrate according to the present invention. The substrate is put in an ambient atmosphere containing hydrogen chloride diluted by oxygen by 10% and visible or near infrared radiation of which wavelength is mainly from 0.8 to 1.4 μm is irradiated on the substrate. Carbon tetrachloride, silicon tetrachloride, nitrogen trifluoride and dicarbon hexafluoride may be used instead of hydrogen chloride. The temperature at this time is, for instance, 1100° C., which is the temperature of a silicon wafer sent by a monitor. The irradiation time is 30 seconds. In this process, silicon oxide film 608 with a thickness of 150 Å is formed on the surfaces of an active layers. (FIG. 8(C)).

After irradiation of visible or near infrared radiation, the substrate is dipped in buffer hydrofluoric solution to etch the silicon oxide film 608 formed on the surface of the substrate. By this process, the density of nickel in active layers is reduced up to $1\times10^{18}$ cm$^{-3}$ (limitation of measurement by SIMS) or less. Then, gate insulating film 609, and gate electrodes 610 and 611 are formed as in embodiment 5 (FIG. 8(D)). Further, an interlayer insulator 612 is formed, a contact hole is formed on the interlayer insulator and metal wirings 613, 614 and 615 are formed. In such a way, a complementary TFT circuit is formed. (FIG. 8(E)).

FIG. 9 shows an outline of a process of embodiment 8. In embodiment 8, thin oxide film is formed on the surface of silicon film in the form of an island in the ambient oxidizing atmosphere by irradiating KrF excimer laser light (wavelength: 248 nm). Embodiment 8 shows an example of the process in which crystallization of silicon film is promoted. Referring to FIG. 9, the process in which a switching transistor for a pixel in an active matrix circuit is formed using silicon film processed as described above will be described.

A substrate 501 cooled by 0.2° C./min. up to 580° C. after first substrate is annealed at a temperature of 640° C. for one hour as in embodiment 5 is used. An underfilm 502 with a thickness of 2000 Å made of silicon oxide and an amorphous silicon film 503 with a thickness of 5000 Å are formed on the substrate. A silicon oxide film with a thickness of from 10 to 100 Å is also formed on the surface of the amorphous silicon film 503 by thermal oxidation or processing using an oxidizing agent such as hydrogen peroxide.

In such a condition, extremely thin nickel acetate layer 504 is formed by spin coating. For a solvent, water or ethanol is used and the density of nickel acetate is 10 to 50 ppm. (FIG. 9(A)).

Then, the substrate is annealed in the ambient atmosphere containing nitrogen at a temperature of 550° C. for 4 to 8 hours. As a result, amorphous silicon film 503 is crystallized by the crystallization promoting action of nickel to be crystalline silicon film 505. It is verified that the areas left still amorphous 1 to some micron in size exist in a part of the crystalline silicon film 505. (FIG. 9(B))

Next, silicon film is etched by well-known photolithography and silicon area in the form of an island 506 is formed. An oxide film left on the surface of the silicon film is removed at this stage.

Next, the substrate is put in an oxygen atmosphere containing hydrogen chloride by 30% and KrF excimer laser light is irradiated on said substrate. The irradiated energy density should be from 250 to 450 mJ/cm$^2$ and for instance, is 300 mJ/cm$^2$, and the substrate is irradiated with 10 to 50 shots per one place. As a result, silicon oxide film 507 with a thickness of from 10 to 50 Å is formed. The energy density and number of shots of laser can be selected depending on the thickness of silicon oxide film 507 to be formed. In this process of irradiating laser light, amorphous areas left in said crystallized silicon film are also crystallized and further, the crystallinity of silicon film can be improved. After this laser light irradiation process, annealing may be performed again under the above-mentioned conditions. (FIG. 9(C))

After irradiation of the laser light, silicon film is cleaned with pure water. Then, silicon oxide film 508 with a thickness of from 1200 Å is deposited as a gate insulating film by plasma-assisted CVD. For the material gas used in the CVD, TEOS ($Si(OC_2H_5)_4$) and oxygen are used and the temperature of the substrate in deposition should be specified between 300 and 550° C., for instance is 400° C.

Next, aluminum containing scandium to 0.01 to 0.2% with a thickness of from 3000 to 8000 Å, for instance with a thickness of 6000 Å is deposited by sputtering. Then, pattern transfer and etching is performed on the aluminum film and a gate electrode 509 is formed.

Next, a dopant having P conductive type is doped in a self-aligning manner by ion implantation into areas other than a gate electrode which functions as a mask. For the doping gas, diborane ($B_2H_6$) is used and the accelerating voltage should be from 40 to 80 kV and for instance is 65 kV. The dose should be from $1\times10^{14}$ to $5\times10^{15}$ cm$^{-2}$ and for instance is $5\times10^{14}$ cm$^{-2}$. As a result, P-type dopant areas 510 and 511 are formed. Then, annealing is performed by irradiation of laser light. For the laser light, KrF excimer laser light (wavelength: 248 nm, pulse width: 20 nsec.) are used. The conditions are the same as those in embodiment 5. (FIG. 9(D))

Next, a silicon oxide film 512 with a thickness of 6000 Å is deposited as an interlayer insulator by plasma-assisted CVD and in the film a contact hole is formed. Then, an electrode and wiring 513 is formed in a P-type dopant area 510 by a metal material such as multilayer film of titanium nitride and aluminum. Further, silicon nitride film 514 with a thickness of from 2000 to 5000 Å, for instance a thickness of 3000 Å is deposited as a passivation film by plasma-assisted CVD. The Si nitride film and silicon oxide film 512 are etched and a contact hole is formed in a dopant area 511. At last, an indium tin oxide film with a thickness of 1000 Å which is transparent conductive material is deposited by sputtering, the film is etched and an electrode for a pixel 515 is formed.

By the above-mentioned process, a transistor for a pixel in an active matrix circuit can be formed. If such elements are arrayed in a matrix, an active matrix circuit can be formed. In this embodiment, for the laser, KrF excimer laser is used, however, of course, any other laser may be used.

When annealing by irradiation of visible or near infrared radiation, or laser light is added to crystalline silicon film which is crystallized by annealing, crystallinity is further promoted and the quality of the film can be refined. As a result, a silicon film having good crystallinity can be produced. Further, by annealing by irradiation of infrared radiation after the insulating film is formed on the silicon film, interfacial levels can be reduced and after these processes, dangling bonds can be removed or neutralized by performing hydrogen annealing in an ambient atmosphere containing hydrogen at a temperature of from 200 to 450° C.

Silicon film is heated in an atmosphere containing chloride or fluoride gas by irradiating visible or near infrared radiation for a short time. Then, a metal element which helps to promote crystallization contained in the Si film is deposited or vaporized as chloride or fluoride. Then, by heating the silicon film in the oxidizing atmosphere containing chloride gas or fluoride or by irradiating visible or near infrared radiation for a short time, oxide film is formed on the surface of the Si film. By etching the oxide film, the density of metal elements in the Si film can be reduced. By these processes, the effect that crystallinity of the silicon film can be further enhanced is also obtained. As the density of metal elements is reduced, the reliability of a thin film semiconductor device, for example, TFT and TFD produced using silicon film processed as described above is enhanced. The characteristics of the TFT and TFD are also enhanced because crystallinity is improved. As described above, the present invention is extremely effective in formation of an insulated gate semiconductor device.

What is claimed is:

1. A method of manufacturing a semiconductor device comprising the steps of:
   forming a non-single crystalline semiconductor film over an insulating surface of a substrate;
   providing a material for promoting crystallization to a portion of the non-single crystalline semiconductor film;
   crystallizing the non-single crystalline semiconductor film by heating after providing the material;
   forming a gate insulating film over the semiconductor film;
   forming first and second gate electrodes over the gate insulating film;
   adding a first impurity element to the semiconductor film by using the first gate electrode to form a pair of first impurity regions;
   adding a second impurity element to the semiconductor film by using the second gate electrode to form a pair of second impurity regions; and
   forming a common wiring connected to one of the pair of first impurity regions and one of the pair of second impurity regions wherein said one of the pair of first impurity regions is continuous with said one of the pair of second impurity regions, wherein said portion of the semiconductor film is included in said one of the pair of first impurity regions and said one of the pair of second impurity regions.

2. A method according to claim 1 wherein the material for promoting crystallization comprises a metal selected from the group consisting of Fe, Co, Ni, Ru, Rh, Pd, Os, Ir, Pt, Cr, Mn, Cu and Zn.

3. A method according to claim 1, wherein the heating is carried out at a temperature 400–650° C.

4. A method according to claim 1, wherein the first and second impurity elements impart P-type and N-type conductivity, respectively.

5. A method of manufacturing a semiconductor device comprising the steps of:
   forming a non-single crystalline semiconductor film over an insulating surface of a substrate;
   providing a material for promoting crystallization to a portion of the non-single crystalline semiconductor film;
   crystallizing the non-single crystalline semiconductor film by heating after providing the material;
   irradiating the semiconductor film with a laser light after heating;
   forming a gate insulating film over the semiconductor film;
   forming first and second gate electrodes over the gate insulating film;
   adding a first impurity element to the semiconductor film by using the first gate electrode to form a pair of first impurity regions;

adding a second impurity element to the semiconductor film by using the second gate electrode to form a pair of second impurity regions; and forming a common wiring connected to one of the pair of first impurity regions and one of the pair of second impurity regions, wherein the common wiring is formed over the portion of the semiconductor film, wherein said one of the pair of first impurity regions is continuous with said one of the pair of second impurity regions, wherein said portion of the semiconductor film is included in said one of the pair of first impurity regions and said one of the pair of second impurity regions.

6. A method according to claim 5 wherein the material for promoting crystallization comprises a metal selected from the group consisting of Fe, Co, Ni, Ru, Rh, Pd, Os, Ir, Pt, Cr, Mn, Cu and Zn.

7. A method according to claim 5, wherein the heating is carried out at a temperature 400–650° C.

8. A method according to claim 5, wherein the first and second impurity elements impart P-type and N-type conductivities, respectively.

9. A method of manufacturing a semiconductor device comprising the steps of:

forming a non-single crystalline semiconductor film over an insulating surface of a substrate;

providing a material for promoting crystallization to a portion of the non-single crystalline semiconductor film;

crystallizing the non-single crystalline semiconductor film by heating after providing the material;

irradiating the semiconductor film with a laser light after heating;

forming a gate insulating film over the semiconductor film;

forming first and second gate electrodes over the gate insulating film;

adding a first impurity element to the semiconductor film by using the first gate electrode to form a pair of first impurity regions;

adding a second impurity element to the semiconductor film by using the second gate electrode to form a pair of second impurity regions; and forming a common wiring connected to one of the pair of first impurity regions and one of the pair of second impurity regions, wherein said one of the pair of first impurity regions is contiguous with said one of the pair of second impurity regions, wherein at least said one of the first impurity regions or said one of the second impurity regions includes the portion of the semiconductor film.

10. A method according to claim 9 wherein the material for promoting crystallization comprises a metal selected from the group consisting of Fe, Co, Ni, Ru, Rh, Pd, Os, Ir, Pt, Cr, Mn, Cu and Zn.

11. A method according to claim 9, wherein the heating is carried out at a temperature 400–650° C.

12. A method according to claim 9, wherein the first and second impurity elements impart P-type and N-type conductivity, respectively.

13. A method of manufacturing a semiconductor device comprising the steps of:

forming a non-single crystalline semiconductor film over an insulating surface of a substrate;

providing a material for promoting crystallization to a portion of the non-single crystalline semiconductor film;

crystallizing the non-single crystalline semiconductor film by heating after providing the material;

irradiating the semiconductor film with a laser light after heating;

forming a gate insulating film over the semiconductor film;

forming first and second gate electrodes over the gate insulating film;

adding a first impurity element to the semiconductor film by using the first gate electrode to form a pair of first impurity regions;

adding a second impurity element to the semiconductor film by using the second gate electrode to form a pair of second impurity regions;

forming an interlayer insulator over the first and second gate electrodes;

forming a contact hole in the interlayer insulator and the gate insulating film; and forming a common wiring connected to one of the pair of first impurity regions and one of the pair of second impurity regions through the contact hole, wherein said one of the pair of first impurity regions is continuous with said one of the pair of second impurity regions, wherein said portion of the semiconductor film is included in said one of the pair of first impurity regions and said one of the pair of second impurity regions.

14. A method according to claim 13 wherein the material for promoting crystallization comprises a metal selected from the group consisting of Fe, Co, Ni, Ru, Rh, Pd, Os, Ir, Pt, Cr, Mn, Cu and Zn.

15. A method according to claim 13, wherein the heating is carried out at a temperature 400–650° C.

16. A method according to claim 13, wherein the first and second impurity elements impart P-type and N-type conductivity, respectively.

* * * * *